(12) United States Patent
Takamine

(10) Patent No.: US 6,879,086 B2
(45) Date of Patent: Apr. 12, 2005

(54) SURFACE ACOUSTIC WAVE APPARATUS AND COMMUNICATION APPARATUS USING THE SAME

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 36 days.

(21) Appl. No.: 10/650,426

(22) Filed: Aug. 28, 2003

(65) Prior Publication Data

US 2004/0066115 A1 Apr. 8, 2004

(30) Foreign Application Priority Data

Aug. 28, 2002 (JP) ........................................ 2002-248204

(51) Int. Cl.[7] .............................................. H01L 41/08
(52) U.S. Cl. .................................. 310/313 D; 333/195
(58) Field of Search ........................ 310/313 R, 313 B, 310/313 D; 333/193–196

(56) References Cited

U.S. PATENT DOCUMENTS 6,670,868 B2 * 12/2003 Kawase et al. ............. 333/193
6,744,333 B2 * 6/2004 Sawada ....................... 333/133
6,771,144 B2 * 8/2004 Takamine .................... 333/133
6,781,478 B2 * 8/2004 Takamine et al. ........... 333/133
6,815,868 B2 * 11/2004 Shibata et al. ........... 310/313 D
6,816,036 B2 * 11/2004 Takamine .................... 333/195

FOREIGN PATENT DOCUMENTS

JP  07-030367  1/1995

* cited by examiner

*Primary Examiner*—Mark Budd
(74) *Attorney, Agent, or Firm*—Keating & Bennett, LLP

(57) ABSTRACT

A surface acoustic wave apparatus includes at least one longitudinally-coupled-resonator surface acoustic wave filter having at least three IDTs arranged on a piezoelectric substrate along the propagation direction of surface acoustic waves and at least one surface acoustic wave resonator that is connected in series to at least two of the IDTs of the longitudinally-coupled-resonator surface acoustic wave filter. The parasitic capacitance between the longitudinally-coupled-resonator surface acoustic wave filter and the surface acoustic wave resonator is about $6.5 \times 10^2/f_0$ [pF] or less, where $f_0$ represents the center frequency (MHz) within the pass band of the longitudinally-coupled-resonator surface acoustic wave filter.

18 Claims, 34 Drawing Sheets

SURFACE ACOUSTIC WAVE APPARATUS AND COMMUNICATION APPARATUS USING THE SAME

BACKGROUND OF THE INVENTION

1. Field of the Invention

The present invention relates to a surface acoustic wave apparatus having greatly improved transmission characteristics and a communication apparatus including such a surface acoustic wave apparatus.

2. Description of the Related Art

Mobile phone (communication device) technology has advanced remarkably in recent years. In order to achieve such technology, surface acoustic wave apparatuses used in the radio-frequency (RF) stages of the mobile phones must provide higher performance. Such a known surface acoustic wave apparatuses is disclosed in, for example, Japanese Unexamined Patent Application Publication No. 7-30367, in which surface acoustic wave resonators are connected in series to surface acoustic wave filters, particularly to longitudinally-coupled-resonator surface acoustic wave filters.

FIG. 3 shows this structure. In FIG. 3, a surface acoustic wave resonator 102 is connected in series to a longitudinally-coupled-resonator surface acoustic wave filter 101 having three interdigital electrode transducers (IDTs). The anti-resonant frequency of the surface acoustic wave resonator 102 is set to a frequency that is greater than the pass band of the longitudinally-coupled-resonator surface acoustic wave filter 101 and the resonant frequency of the surface acoustic wave resonator 102 is set within the pass band.

In such a structure, since the anti-resonant frequency of the surface acoustic wave resonator 102 is set to a frequency that is greater than the pass band of the longitudinally-coupled-resonator surface acoustic wave filter 101, the attenuation increases in the vicinity of frequencies greater than the pass band. However, since the resonant frequency of the surface acoustic wave resonator 102 is set within the pass band, the insertion loss within the pass band is not substantially increased.

Heretofore, characteristic selection has been performed in a wafer form, in addition to upon completion of a product, in the production of a surface acoustic wave apparatus in order to eliminate defective products produced in the manufacturing process. The elimination of defective products in a wafer form prevents the elements in the defective products from being mounted in packages, thus reducing package waste and achieving cost reduction.

Dedicated characteristic selection pads are provided for performing characteristic selection in the wafer form through a measurement using a probe. These characteristic selection pads are usually connected adjacent to electrode pads for connecting the surface acoustic wave resonator to packages for the purpose of reducing the capacitance in signal lines. The dedicated characteristic selection pads are provided because the electrode pads can be damaged by contact with the tip of the probe when the measurement is performed, thus, causing defective connection to the package.

FIG. 4 shows an example of the layout of the surface acoustic wave apparatus having the structure shown in FIG. 3 on a piezoelectric substrate. In FIG. 4, squares having a diagonal grid represent bump-bonding electrode pads or wire-bonding electrode pads 105 and squares having diagonal lines represent characteristic selection pads 106 for measuring the filter characteristics in a wafer form using the probe.

However, with the structure of FIG. 3, the insertion loss within the pass band increases as compared with the structure without the surface acoustic wave resonator 102 connected in series. An examination reveals that the insertion loss within the pass band is adversely affected by the parasitic capacitance between the longitudinally-coupled-resonator surface acoustic wave filter 101 and the surface acoustic wave resonator 102.

Particularly, in the structure in FIG. 4 in which the surface acoustic wave resonator 102 is connected in series to at least two IDTs of the longitudinally-coupled-resonator surface acoustic wave filter 101, two signal lines 103 and 104 that connect the longitudinally-coupled-resonator surface acoustic wave filter 101 to the surface acoustic wave resonator 102 surround the electrode pads 105 and the characteristic selection pad 106. Accordingly, large parasitic capacitance is generated between the two signal lines 103 and 104, and the electrode pads 105 and the characteristic selection pad 106 which causes the insertion loss within the pass band to increase.

SUMMARY OF THE INVENTION

To overcome the problems described above, preferred embodiments of the present invention provide a surface acoustic wave apparatus in which the surface acoustic wave resonator 102 is connected in series to the longitudinally-coupled-resonator surface acoustic wave filter 101, as shown in FIG. 3, and which has a greatly decreased insertion loss within the pass band, and which includes a layout that greatly reduces the parasitic capacitance of the surface acoustic wave apparatus on a piezoelectric substrate.

A first preferred embodiment of the present invention provides a surface acoustic wave apparatus including at least one longitudinally-coupled-resonator surface acoustic wave filter having at least three IDTs provided on a piezoelectric substrate along the propagation direction of surface acoustic waves and at least one surface acoustic wave resonator that is connected in series to at least two of the IDTs of the longitudinally-coupled-resonator surface acoustic wave filter. The parasitic capacitance between the longitudinally-coupled-resonator surface acoustic wave filter and the surface acoustic wave resonator is set to about $6.5 \times 10^2/f_0$ [pF] or less, where $f_0$ represents the center frequency (MHz) within the pass band of the longitudinally-coupled-resonator surface acoustic wave filter.

With the above-described structure, since the parasitic capacitance between the longitudinally-coupled-resonator surface acoustic wave filter and the surface acoustic wave resonator is preferably set to about $6.5 \times 10^2/f_0$ [pF] or less, an increase in the insertion loss caused by the parasitic capacitance and an increase in the VSWR are prevented. Accordingly, a surface acoustic wave apparatus having greatly reduced insertion loss within the pass band and superior transmission characteristics is achieved.

A second preferred embodiment of the present invention provides a surface acoustic wave apparatus including at least one longitudinally-coupled-resonator surface acoustic wave filter having at least three IDTs provided on a piezoelectric substrate along the propagation direction of surface acoustic waves, at least one surface acoustic wave resonator that is connected in series to at least two of the IDTs of the longitudinally-coupled-resonator surface acoustic wave filter, ground-side electrode pads, and characteristic selection pads. The ground-side electrode pads are each connected to a center IDT of the longitudinally-coupled-resonator surface acoustic wave filter and are surrounded by signal lines that connect in series at least two of the IDTs of the longitudinally-coupled-resonator surface acoustic wave filter to the surface acoustic wave resonator. The characteristic selection pads are arranged adjacent to electrode pads other than the ground-side electrode pads.

With the above-described structure, since the surface acoustic wave apparatus includes the characteristic selection pads that are arranged adjacent to the electrode pads, the characteristics of surface acoustic wave apparatuses can be measured using a probe through the characteristic selection pads and to select a surface acoustic wave apparatus based on the measured result.

Further, since the characteristic selection pads are arranged adjacent to the electrode pads other than the ground-side electrode pads connected to the center IDTs of the longitudinally-coupled-resonator surface acoustic wave filter, which are surrounded by the signal lines that connect in series at least two of the IDTs of the longitudinally-coupled-resonator surface acoustic wave filter to the surface acoustic wave resonator, the characteristic selection pads are not arranged adjacent to the ground-side electrode pads that are surrounded by the signal lines and are connected to the center IDTs.

Accordingly, the increase in the parasitic capacitance caused by the characteristic selection pads that are adjacent to the ground-side electrode pads is suppressed and the parasitic capacitance is preferably set to, for example, about $6.5 \times 10^2/f_0$ [pF] or less, such that the increase in the insertion loss caused by the parasitic capacitance and the increase in the VSWR are prevented. Thus, the surface acoustic wave apparatus according to this preferred embodiment has greatly reduced insertion loss within the pass band and superior transmission characteristics.

It is preferable that the longitudinally-coupled-resonator surface acoustic wave filter include reflectors, and that, among the IDTs of the longitudinally-coupled-resonator surface acoustic wave filter, each ground terminal of the IDTs other than the IDTs that are connected to the surface acoustic wave resonator and the IDTs that are adjacent to the reflectors are connected to only one electrode pad. Ground-side interdigital electrodes of the IDTs other than the IDTs that are connected to the surface acoustic wave resonator and the IDTs that are adjacent to the reflectors are preferably connected to each other through electrode fingers.

With the above-described structure, since the ground-side interdigital electrodes of the IDTs other than the IDTs that are connected to the surface acoustic wave resonator and the IDTs that are adjacent to the reflectors are connected to each other through electrode fingers, the characteristic selection pads are not adjacent to the ground-side electrode pads that are surrounded by the signal lines and are connected to the center IDTs.

Accordingly, the parasitic capacitance caused by the characteristic selection pads that are adjacent to the ground-side electrode pads is not increased, and the parasitic capacitance is preferably set to, for example, about $6.5 \times 10^2/f_0$ [pF] or less, such that the increase in the insertion loss caused by the parasitic capacitance and the increase in the VSWR are inhibited, thus, achieving a surface acoustic wave apparatus having greatly reduced insertion loss within the pass band and superior transmission characteristics.

The longitudinally-coupled-resonator surface acoustic wave filter preferably includes three or five IDTs.

In the longitudinally-coupled-resonator surface acoustic wave filter, bus bars of interdigital electrodes are preferably configured so as to be thinner than in the other areas, at locations where signal-side interdigital electrodes of the IDTs that are connected to the surface acoustic wave resonator are adjacent to ground-side interdigital electrodes of the IDTs that are adjacent to the IDTs connected to the surface acoustic wave resonator.

With the structure described above, the bus bars of the interdigital electrodes are configured so as to be thinner than in the other areas, in areas where the above signal-side interdigital electrodes are adjacent to the ground-side interdigital electrodes, such that the parasitic capacitance is further reduced. Hence, the increase in the insertion loss caused the parasitic capacitance and the increase in the VSWR are prevented, thus, achieving a surface acoustic wave apparatus having greatly reduced insertion loss within the pass band and superior transmission characteristics.

The surface acoustic wave apparatus preferably includes an insulating layer that is provided between the piezoelectric substrate, and at least one of an electrode pad at the side on which the surface acoustic wave resonator is connected, which is connected to the ground terminal of the center IDT, a ground line that connects the ground terminal of the center IDT to a electrode pad, and signal lines that connect the longitudinally-coupled-resonator surface acoustic wave filter and the surface acoustic wave resonator, in the longitudinally-coupled-resonator surface acoustic wave filter.

With the above-described structure, the insulating layer having a smaller relative dielectric constant than that of the piezoelectric substrate provided between the piezoelectric substrate and at least one of the electrode pad, the ground line, and the signal lines greatly reduces the parasitic capacitance and greatly improves the characteristics.

The surface acoustic wave apparatus according to a preferred embodiment of the present invention preferably includes a balanced-to-unbalanced conversion function. In the surface acoustic wave apparatus according to a preferred embodiment of the present invention, the piezoelectric substrate is preferably provided in a package by a face-down technique.

A communication apparatus according to another preferred embodiment of the present invention includes any of the surface acoustic wave apparatuses described above. With this structure, since the communication apparatus includes the surface acoustic wave apparatus having a greatly reduced insertion loss and superior transmission characteristics, the communication apparatus has greatly improved communication characteristics.

The above and other elements, characteristics, features, and advantages of the present invention will become clear from the following description of preferred embodiments taken in conjunction with the accompanying drawings.

DETAILED DESCRIPTION OF PREFERRED EMBODIMENTS

Figure 1:
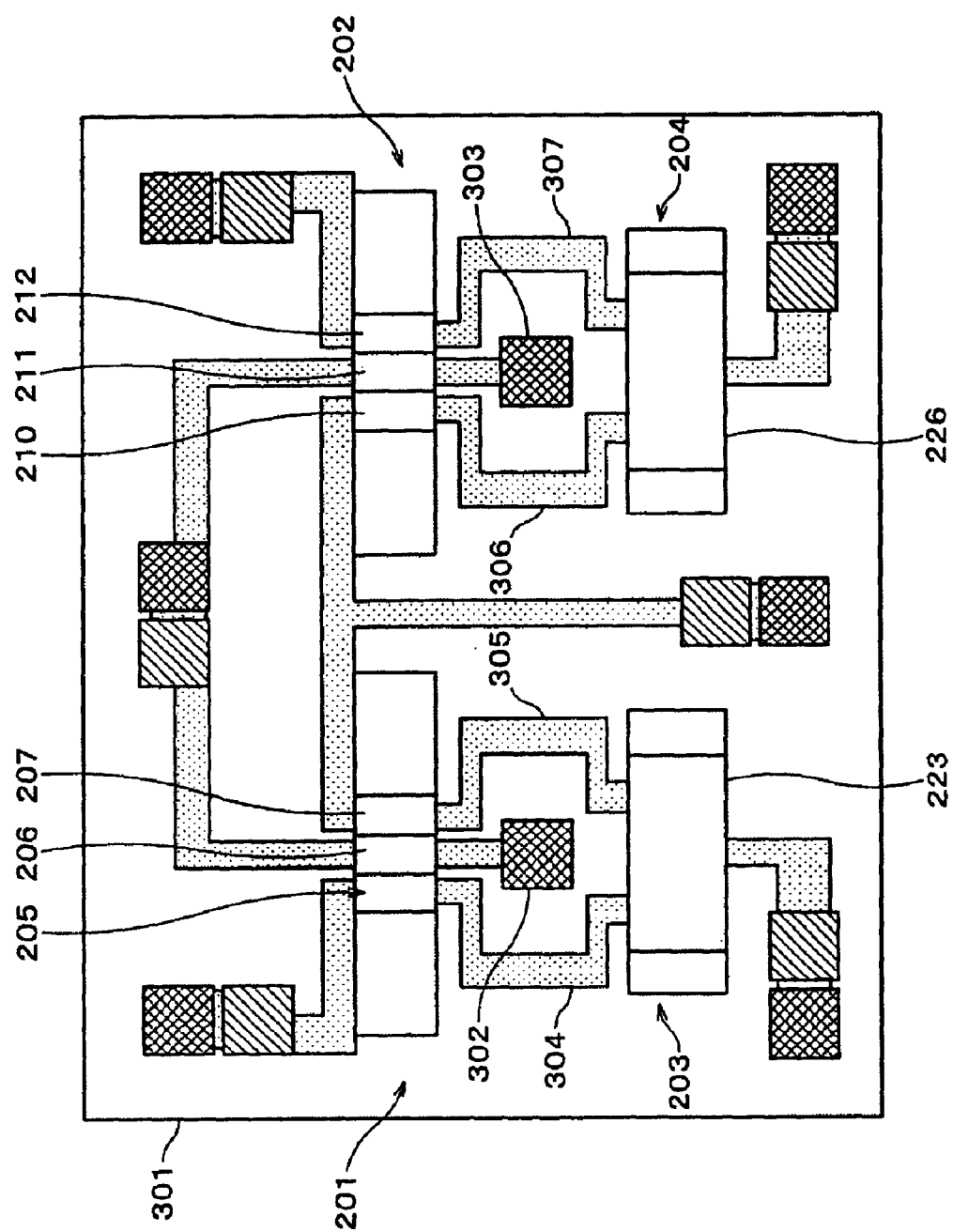
FIG. 1 is a plan view schematically showing the layout of a surface acoustic wave apparatus according to a first preferred embodiment of the present invention on a piezoelectric substrate.

Surface acoustic wave apparatuses according to preferred embodiments of the present invention will now be described with reference to FIGS. 1 and 2 and FIGS. 5 to 34.

First Preferred Embodiment

A surface acoustic wave apparatus according to a first preferred embodiment of the present invention will now be described with reference to FIGS. 1, 2, and 5. The preferred embodiments of the present invention will be described in the context of a digital communication system (DCS) reception filter (the center frequency within the pass band is 1842.5 MHz). First, the electrode structure according to the first preferred embodiment will be described with reference to FIG. 2.

Longitudinally-coupled-resonator surface acoustic wave filters 201 and 202 and surface acoustic wave resonators 203 and 204 that are connected in series to the longitudinally-coupled-resonator surface acoustic wave filters 201 and 202, respectively, are provided on a piezoelectric substrate 301 preferably made of X-propagation LiTaO$_3$ that is Y-cut at 40±5°. The longitudinally-coupled-resonator surface acoustic wave filters 201 and 202 and the surface acoustic wave resonators 203 and 204 preferably include aluminum electrodes.

The longitudinally-coupled-resonator surface acoustic wave filters 201 and 202 are preferably arranged along the propagation direction of surface acoustic waves to reduce the size thereof. The surface acoustic wave resonators 203 and 204 are also preferably arranged along the propagation direction of the surface acoustic waves to reduce the size thereof. The surface acoustic wave apparatus of the first preferred embodiment provides a balanced-to-unbalanced conversion function via the longitudinally-coupled-resonator surface acoustic wave filters 201 and 202.

In the longitudinally-coupled-resonator surface acoustic wave filter 201, interdigital electrode transducers (IDTs) 205 and 207 are provided such that an IDT 206 is sandwiched therebetween along the propagation direction of the surface acoustic waves. These IDTs 205, 206, and 207 are sandwiched between reflectors 208 and 209.

The IDT 205 includes a zonal base end (bus bar) and two interdigital electrodes having a plurality of electrode fingers that are substantially parallel to each other and that extend from one side of the base end substantially perpendicularly to the side. In the IDT 205, the electrode fingers of the interdigital electrodes are combined with each other such that the sides of an electrode finger oppose the sides of the adjacent electrode fingers on both sides.

With the IDT 205, controlling the length and width of each electrode finger, the spacing between opposing electrode fingers, and the facing length of the combined electrode fingers enable the signal conversion characteristics or the pass band to be set. The other IDTs in the longitudinally-coupled-resonator surface acoustic wave filter 201 preferably have the same structure as the IDT 205. The reflectors 208 and 209 reflect the propagated surface acoustic waves in the propagation direction.

Figure 2:
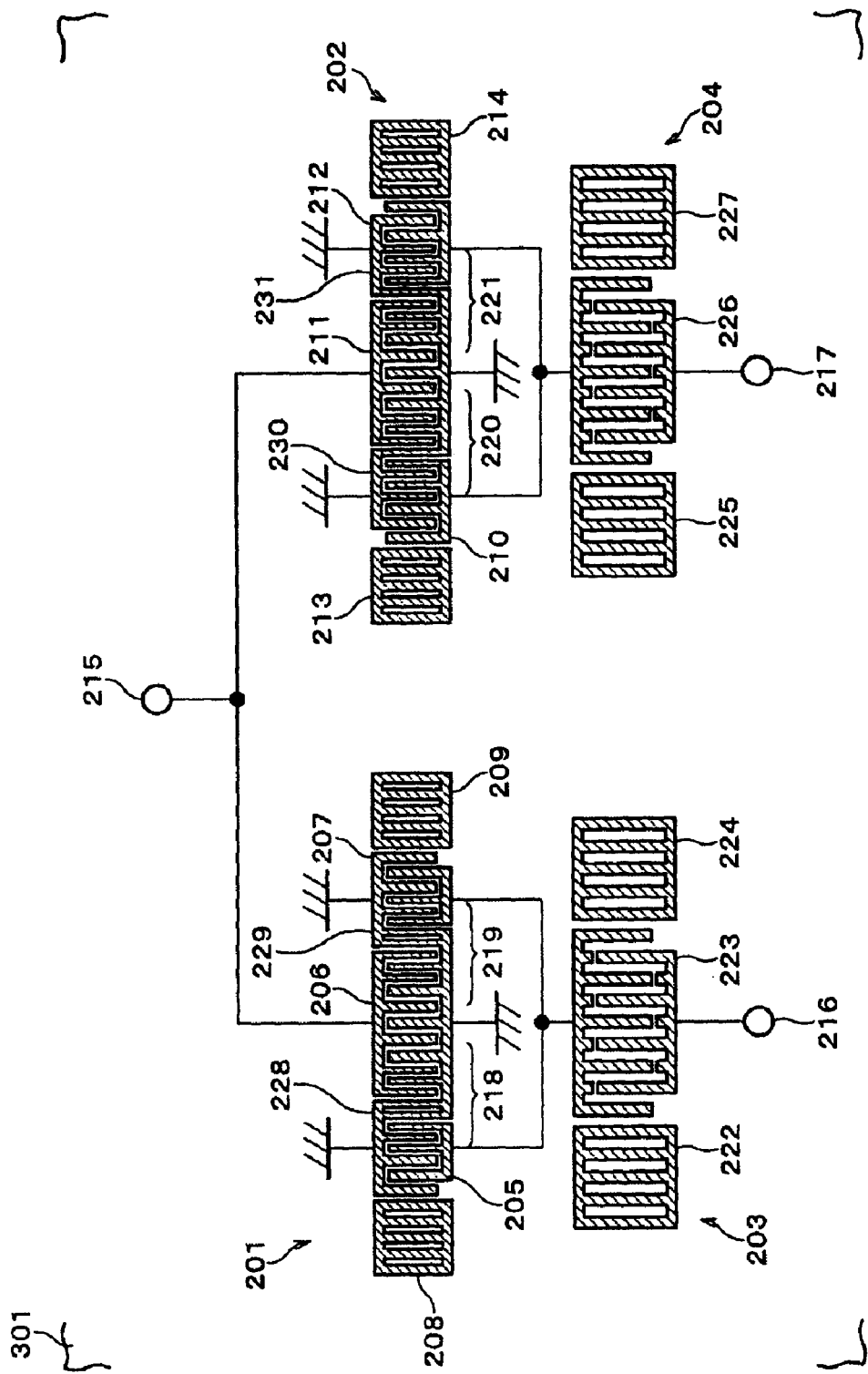
FIG. 2 shows the structure of the surface acoustic wave apparatus of the first preferred embodiment of the present invention.
Figure 3:
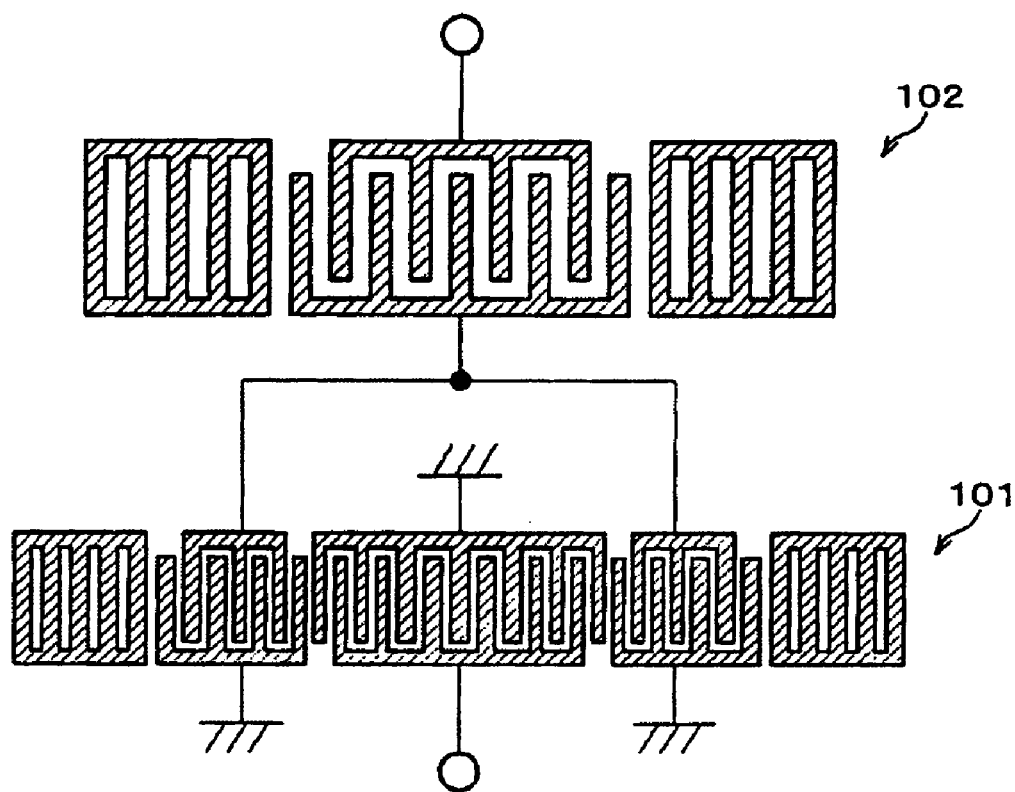
FIG. 3 shows the structure of a conventional surface acoustic wave apparatus.
Figure 4:
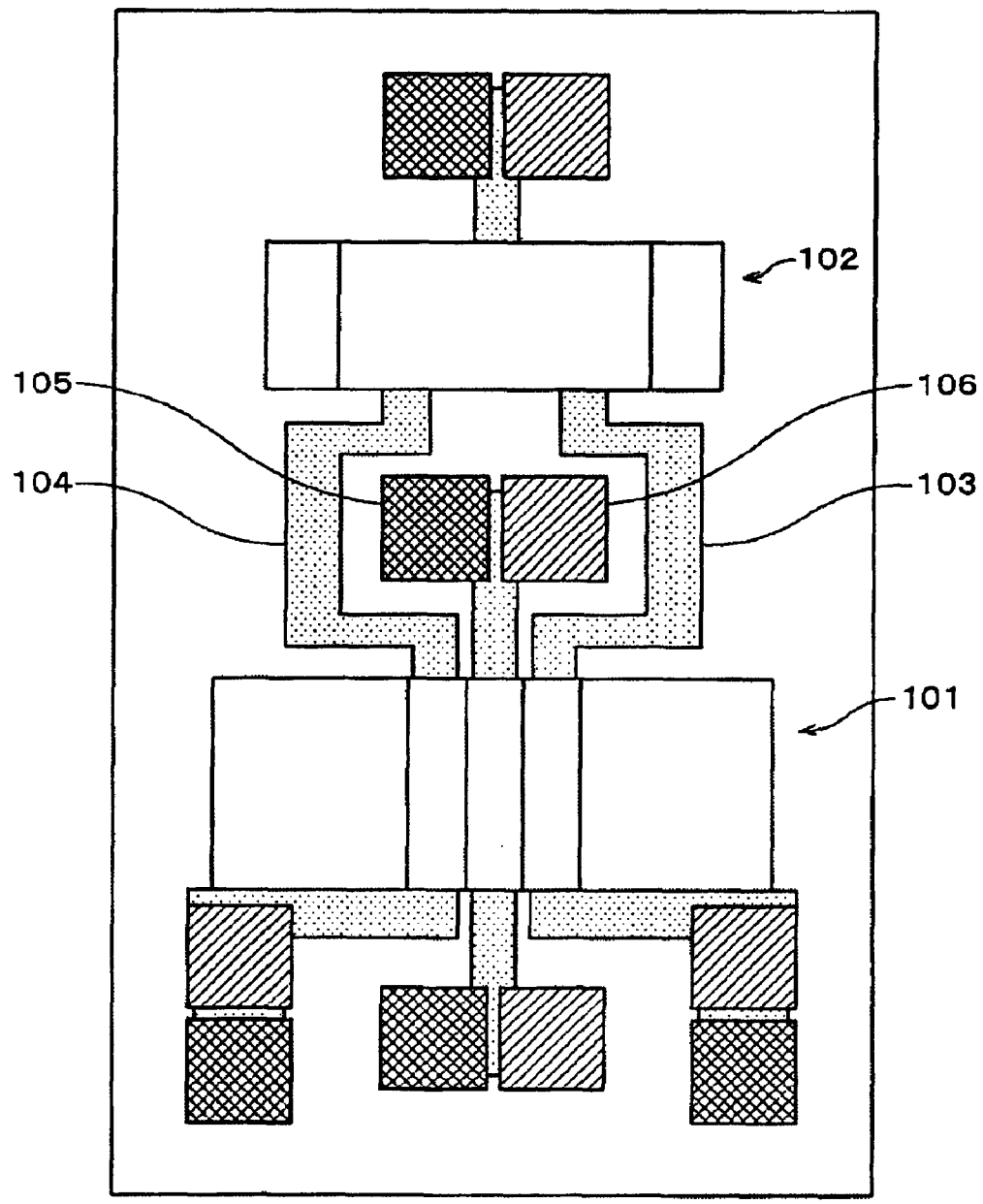
FIG. 4 is a plan view schematically showing the layout of the conventional surface acoustic wave apparatus on a piezoelectric substrate.

Referring to FIG. 2, the spacing between some electrode fingers in the area between the IDTs 205 and 206 (an area 218 in FIG. 2) and in the area between the IDTs 206 and 207 (an area 219 in FIG. 2) is less than the spacing between the electrode fingers in the other areas.

Although the longitudinally-coupled-resonator surface acoustic wave filter 202 has substantially the same structure as the longitudinally-coupled-resonator surface acoustic wave filter 201, the longitudinally-coupled-resonator surface acoustic wave filter 202 differs from longitudinally-coupled-resonator surface acoustic wave filter 201 in that the IDTs 210 and 212 have phases that are inverted with respect to those of the IDTs 205 and 207. The IDTs 206 and 211 are connected to an unbalanced signal terminal 215. The IDTs 205 and 207 are connected to a balanced signal terminal 216 through the surface acoustic wave resonator 203, and the IDTs 210 and 212 are connected to a balanced signal terminal 217 through the surface acoustic wave resonator 204.

In the surface acoustic wave resonator 203, reflectors 222 and 224 are provided such that an IDT 223 is sandwiched therebetween along the propagation direction of the surface acoustic waves. The structure of the surface acoustic wave resonator 204 is the same as that of the surface acoustic wave resonator 203. FIG. 1 shows the layout of the electrode structure of the first preferred embodiment on the piezoelectric substrate 301. The same reference numerals are used in FIG. 1 to identify the same components shown in FIG. 2.

Referring to FIG. 1, bump-bonding electrode pads for connecting the piezoelectric substrate 301 to a package are represented by squares filled with a diagonal grid, and characteristic selection pads are represented by squares filled with diagonal lines.

Figure 5:
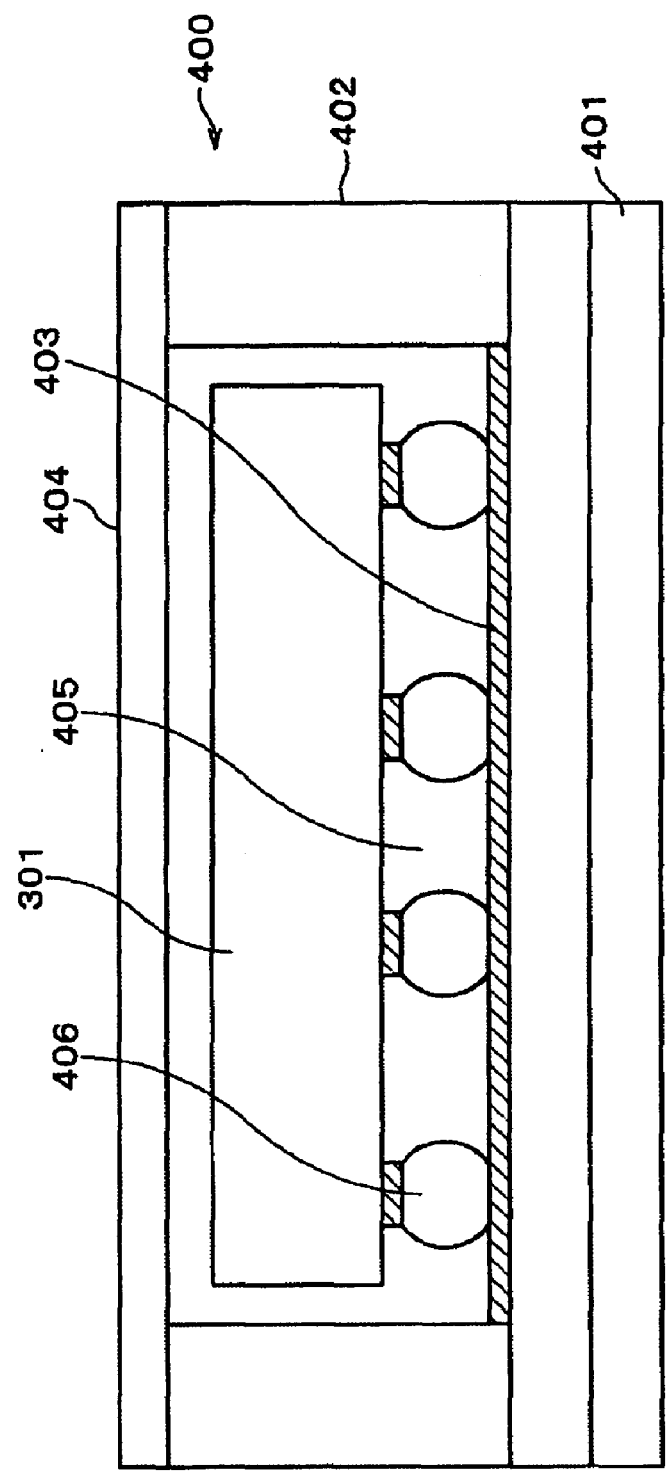
FIG. 5 is a cross-sectional view of the surface acoustic wave apparatus of the first preferred embodiment of the present invention.

The surface acoustic wave apparatus of the first preferred embodiment is produced preferably using a face-down technique, as shown in FIG. 5, where the electrode surface beneath the piezoelectric substrate 301 is connected to a die-mounting surface 403 of a package 400 through bumps 406, and a space 405 is provided beneath the electrode surface of the piezoelectric substrate 301 so as not to inhibit the generation of surface acoustic waves beneath the piezoelectric substrate 301. The package 400 has a base plate 401, side walls 402, and a cap 404.

In the electrode structure of the first preferred embodiment, as shown in FIG. 1, only bump-bonding electrode pads 302 and 303 are connected to the ground terminals of the IDTs 206 and 211, respectively, and no characteristic selection pads are connected to them. The ground terminal of the IDT 206 is between a signal line 304 that connects the IDT 205 to the IDT 223 and a signal line 305 that connects the IDT 207 to the IDT 223. The ground terminal of the IDT 211 is between a signal line 306 that connects the IDT 210 to an IDT 226 and a signal line 307 that connects the IDT 212 to the IDT 226. In the electrode structure of the first preferred embodiment, the characteristic selection pads are connected adjacent to the corresponding bump-bonding electrode pads other than the electrode pads 302 and 303.

The term "adjacent" includes the meaning of "nearly adjacent". The characteristic selection pads are preferably arranged on the signal line that connects the signal terminal or the ground terminal of each IDT to the corresponding bump-bonding electrode pad because such an arrangement avoids an excessive length of the signal line.

Accordingly, as shown in FIG. 2, the ground terminal (ground-side interdigital electrode) of the IDT 206 is used in common with (is connected to) the ground terminal (ground-side interdigital electrode) of the IDT 205 at a portion 228 where the IDT 205 is adjacent to the IDT 206, and is connected the ground terminal of the IDT 207 at a portion 229 where the IDT 206 is adjacent to the IDT 207, through the corresponding electrode fingers. The ground terminal (ground-side interdigital electrode) of the IDT 211 is used in common with (is connected to) the ground terminal (ground-side interdigital electrode) of the IDT 210 at a portion 230 where the IDT 211 is adjacent to the IDT 210, and is connected to the ground terminal of the IDT 212 at a portion 231 where the IDT 211 is adjacent to the IDT 212, through the corresponding electrode fingers.

Hence, the filter characteristics of the surface acoustic wave apparatus can be confirmed in a wafer form through the characteristic selection pad that is connected to the ground terminal of at least one of the IDTs 205 and 207 or that is connected to the ground terminal of at least one of the IDTs 210 and 212, without the characteristic selection pads being connected to the ground terminals of the IDT 206 and the IDT 211, to quickly perform the characteristic selection for the surface acoustic wave apparatus in the wafer form.

The detailed specifications of the longitudinally-coupled-resonator surface acoustic wave filters 201 and 202 are as follows, where λI represents a wavelength determined by the spacing between the electrode fingers that are not arranged at a shorter spacing:

Facing length: about 41.8 λI

Number of IDTs (in the order of IDTs 205, 206, and 207): 18 (3)/(3) 33 (3)/(3) 18 (the figures in the parentheses indicate the numbers of electrode fingers arranged at the shorter spacing)

Number of reflectors: 60 (for the IDT 201), 90 (for the IDT 202)

Duty: about 0.72 (for IDT), about 0.57 (for reflector)

Electrode thickness: about 0.092 λI

The detailed specifications of the surface acoustic wave resonators 403 and 404 are as follows:

Facing length: about 34.9 λI

Number of IDTs: 250

Number of reflectors: 30

Duty: about 0.60

Electrode thickness: about 0.093 λI

Figure 6:
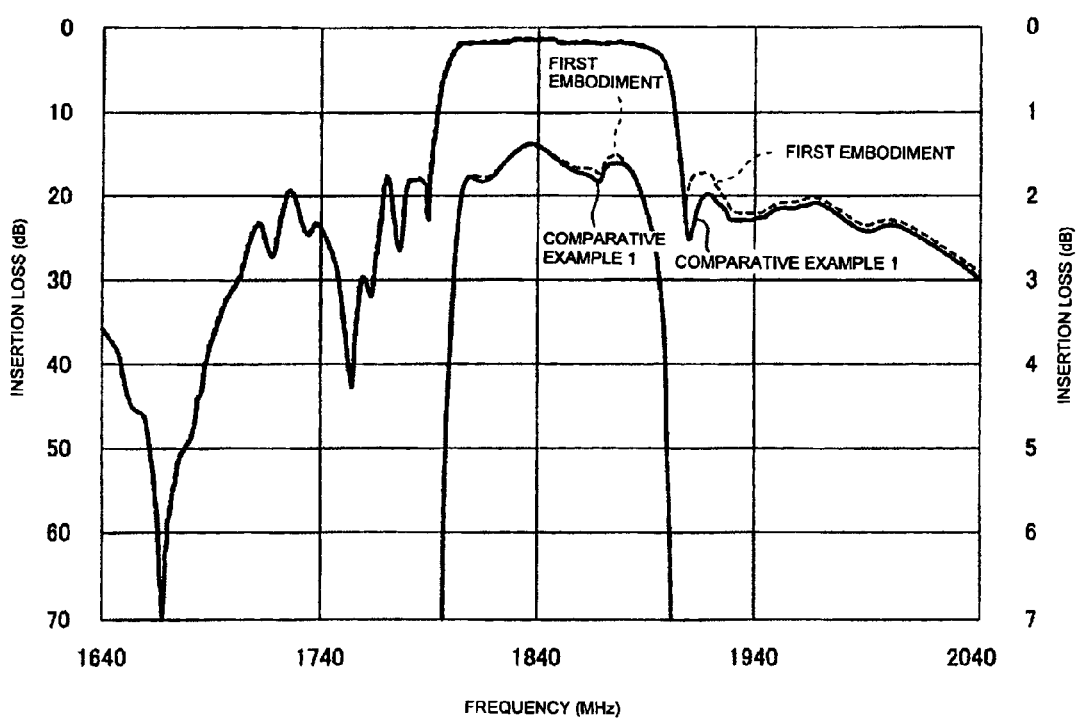
FIG. 6 is a graph showing the frequency-transmission characteristics of the structures of the first preferred embodiment and Comparative example 1.
Figure 7A:
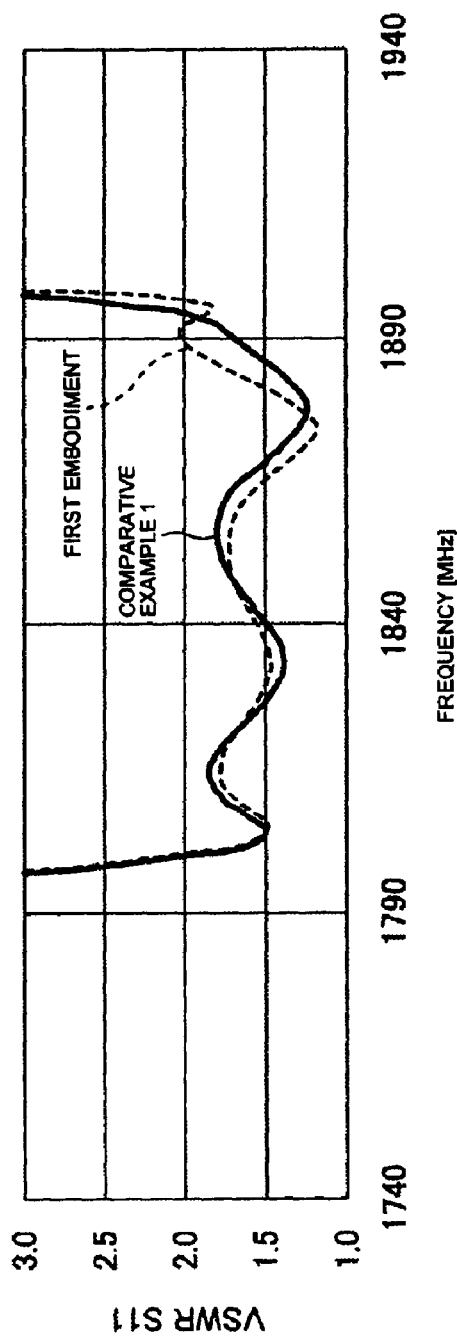
FIG. 7A is a graph showing the frequency-VSWR characteristics for S11 of the structures of the first preferred embodiment and Comparative example 1.
Figure 7B:
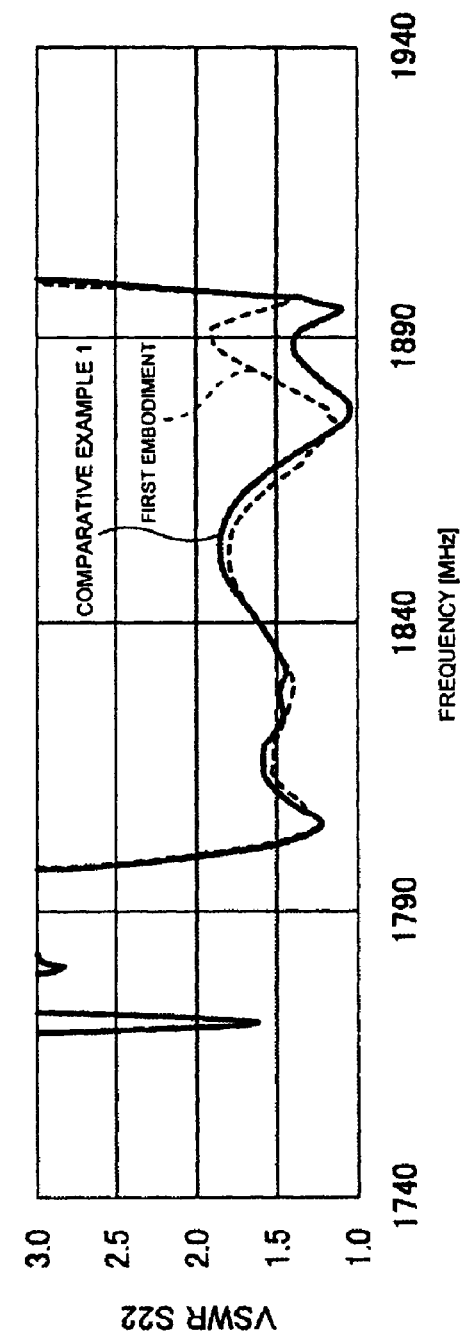
FIG. 7B is a graph showing the frequency-VSWR characteristics for S22 of the structures of the first preferred embodiment and Comparative example 1.
Figure 8:
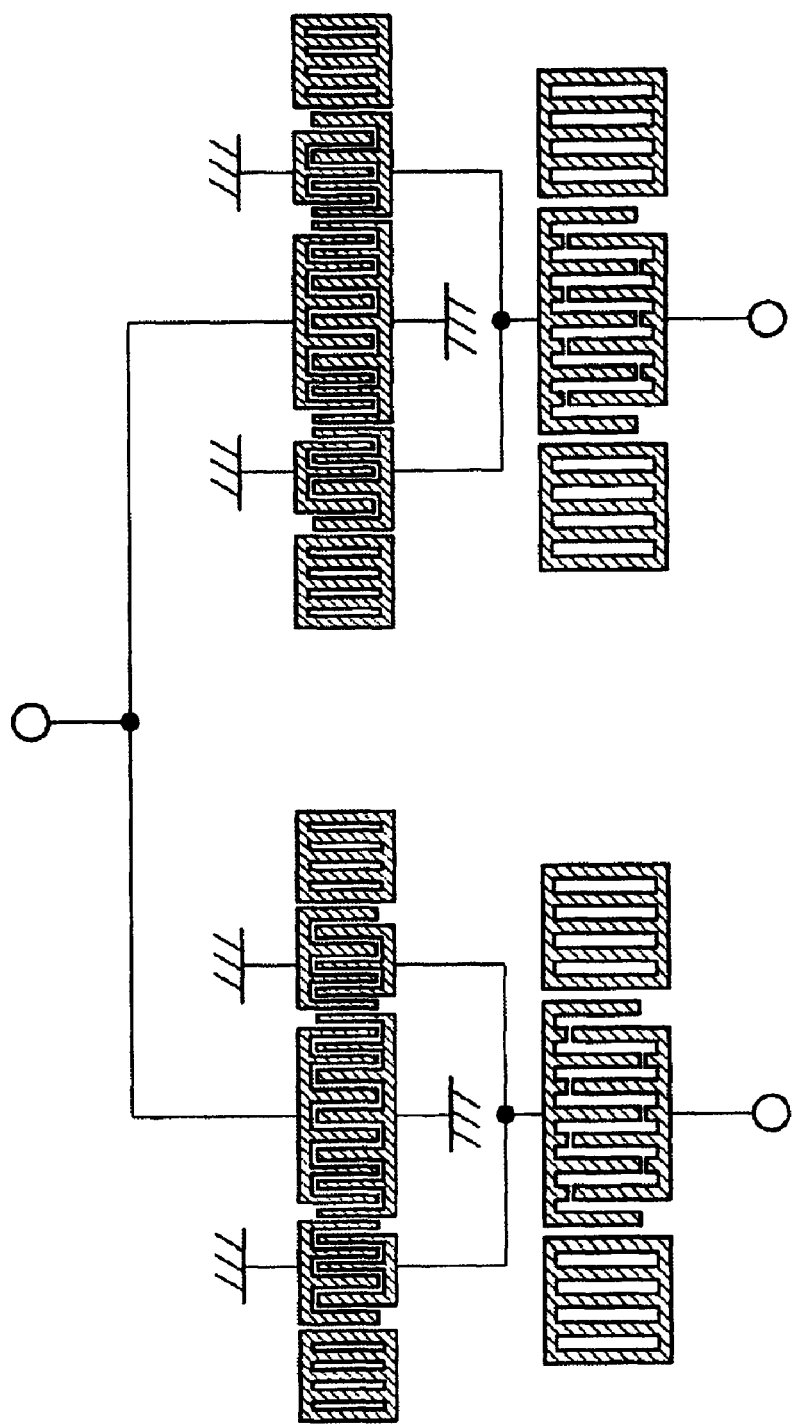
FIG. 8 shows the structure of the surface acoustic wave apparatus of Comparative example 1.
Figure 9:
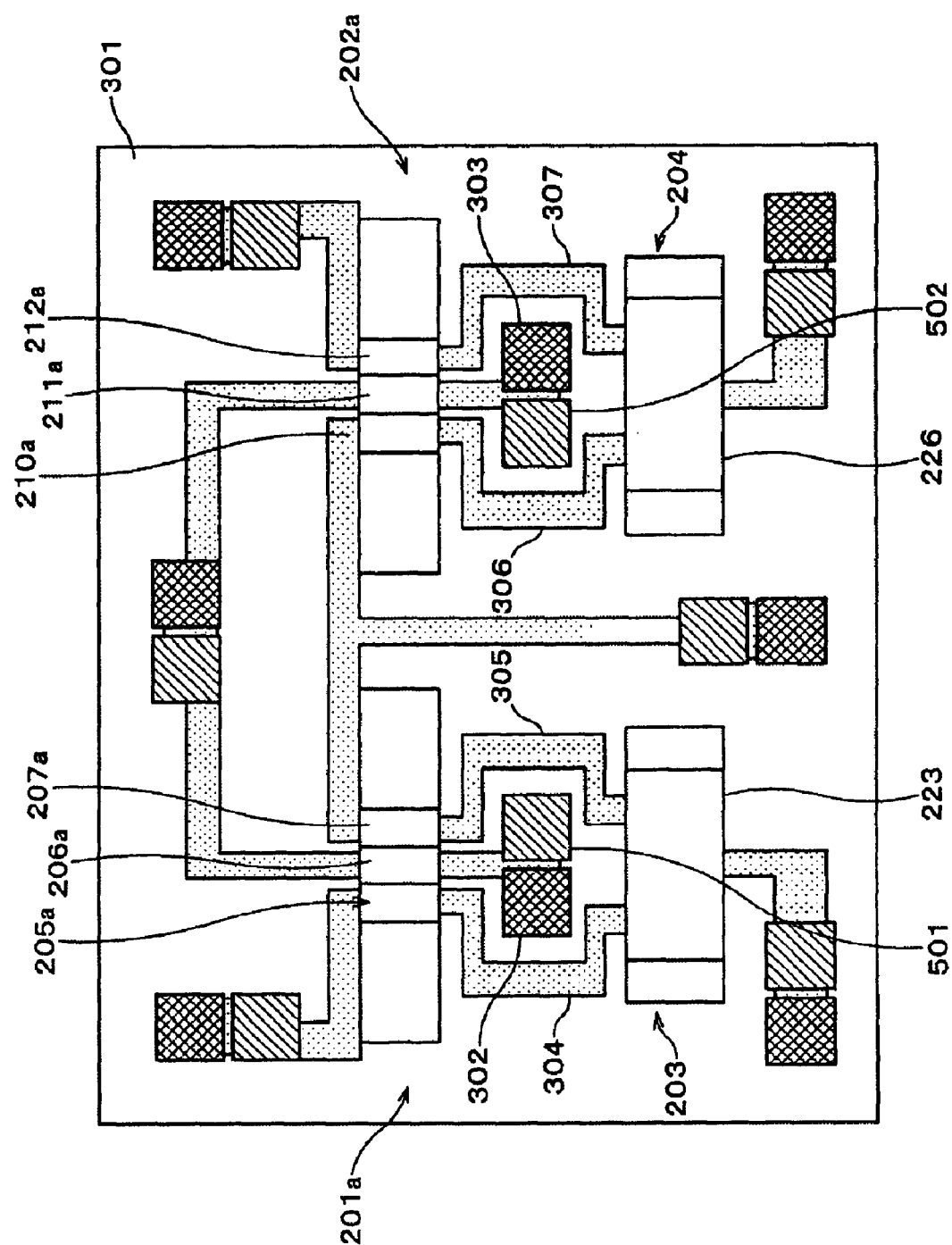
FIG. 9 is a plan view schematically showing the layout of the surface acoustic wave apparatus of Comparative example 1 on a piezoelectric substrate.

Next, the operation and effects of the surface acoustic wave apparatus according to the first preferred embodiment will be described. FIG. 6 shows the frequency-transmission characteristics of the first preferred embodiment. FIGS. 7A and 7B show the frequency-VSWR characteristics of the first preferred embodiment. For comparison, the frequency-transmission characteristics and the frequency-VSWR characteristics of the Comparative Example 1 shown in FIGS. 8 and 9 are also shown in FIGS. 6, 7A, and 7B.

The Comparative Example 1 includes a longitudinally-coupled-resonator surface acoustic wave filter 201a having IDTs 205a to 207a that correspond to the IDTs 205 to 207 of the first preferred embodiment, the ground terminals which are separated from each other, and a longitudinally-coupled-resonator surface acoustic wave filter 202a having IDTs 210a to 212a that correspond to the IDTs 210 to 212, the ground terminals which are separated from each other. The Comparative Example 1 is provided with characteristic selection pads 501 and 502 that are connected to the ground terminals of the IDTs 206a and 211 a, respectively. All the other design parameters in Comparative Example 1 are the same as those in the first preferred embodiment.

The parasitic capacitances between the longitudinally-coupled-resonator surface acoustic wave filter 201 and the surface acoustic wave resonator 203 and between the longitudinally-coupled-resonator surface acoustic wave filter 202 and the surface acoustic wave resonator 204 in the first preferred embodiment were less than the corresponding ones in Comparative Example 1 by about 0.1 pF. Namely, the parasitic capacitance of the first preferred embodiment in FIGS. 1 and 2 was about 0.30 pF, whereas the parasitic capacitance of Comparative Example 1 in FIGS. 8 and 9 was about 0.40 pF.

Referring to FIGS. 6, 7A, and 7B, both the frequency-transmission characteristics and the frequency-VSWR characteristics in the first preferred embodiment are improved as compared to those in Comparative Example 1. The insertion loss within the pass band is greatly improved because of reduced mismatching to the characteristic impedance that is caused by the reduction in parasitic capacitance between the longitudinally-coupled-resonator surface acoustic wave filters and the surface acoustic wave resonators. Other factors causing the insertion loss are also reduced.

Figure 10:
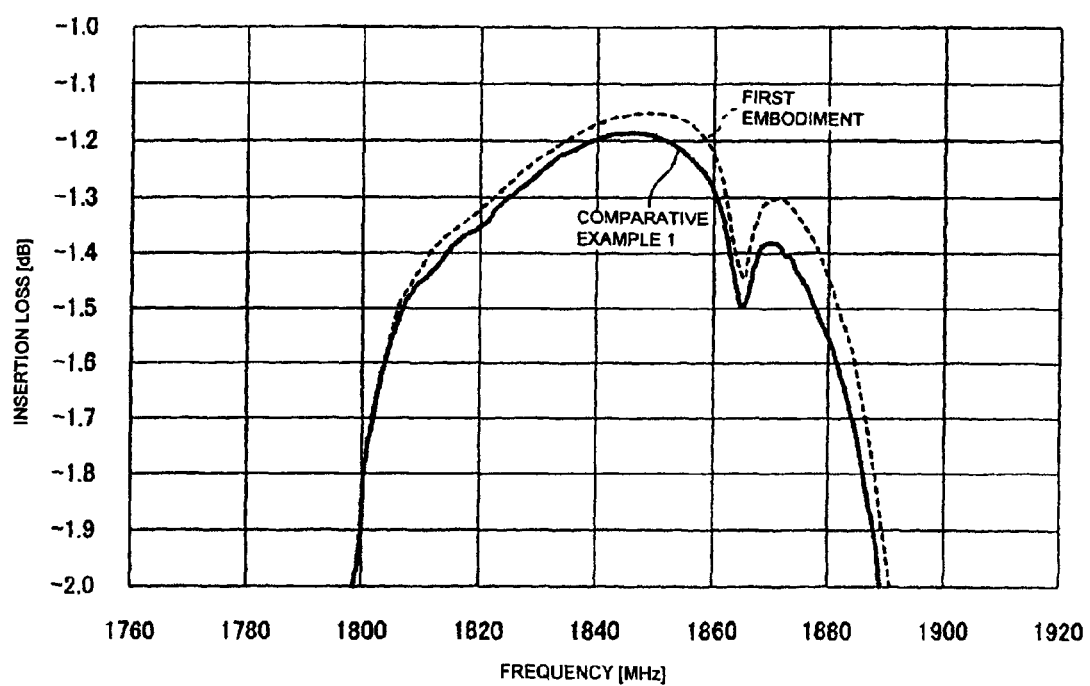
FIG. 10 is a graph showing the frequency-transmission characteristics in a case in which the mismatching loss is removed from the frequency-transmission characteristics in the first preferred embodiment and Comparative example 1.

FIG. 10 shows the frequency-transmission characteristics in a case in which the mismatching loss is removed, by simulation, from the frequency-transmission characteristics in the first preferred embodiment and Comparative Example 1, that is, in which the impedances at all the frequency points are matched to the characteristic impedance.

Referring to FIG. 10, the insertion loss in the first preferred embodiment is less than that in Comparative Example 1, even when the mismatching loss is removed. In other words, the reduction in parasitic capacitance between the longitudinally-coupled-resonator surface acoustic wave filters and the surface acoustic wave resonators decreases not only the mismatching loss but also other factors causing the insertion loss.

Next, the value that the parasitic capacitance between the longitudinally-coupled-resonator surface acoustic wave filters and the surface acoustic wave resonators was determined. Specifically, the parasitic capacitance between the longitudinally-coupled-resonator surface acoustic wave filters and the surface acoustic wave resonators was varied by simulation from about 0.15 pF to about 0.45 pF to determine the value of the insertion loss with which a pass band width of about 75 MHz necessary for the DCS reception filter was met. The results are shown in FIG. 33.

Figure 33:
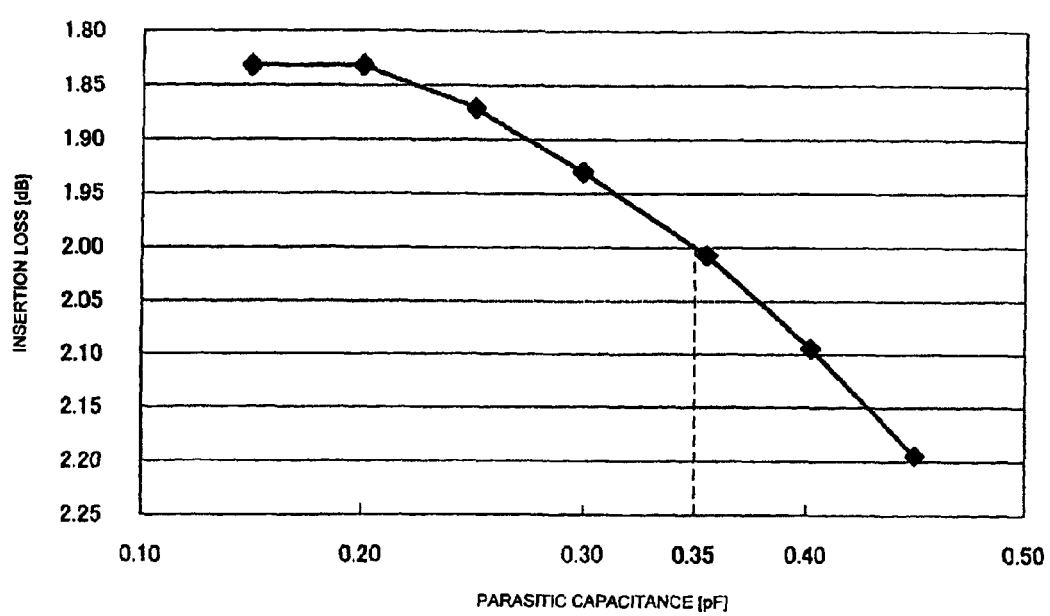
FIG. 33 is a graph that shows standard values of the parasitic capacitance in the surface acoustic wave apparatus of preferred embodiments of the present invention and shows the relationship between the variation in parasitic capacitance and the insertion loss in the surface acoustic wave apparatuses of the first preferred embodiment and Comparative example 1.

Referring to FIG. 33, as the parasitic capacitance between the longitudinally-coupled-resonator surface acoustic wave filters and the surface acoustic wave resonators is reduced, the insertion loss with which a pass band width of 75 Hz is met was reduced. The value of the insertion loss for DCS reception filters required for commercial use is generally about 2 dB at normal temperatures. FIG. 33 shows that the parasitic capacitance between the longitudinally-coupled-resonator surface acoustic wave filters and the surface acoustic wave resonators must be about 0.35 pF or less in order to meet the value mentioned above.

In other words, in the DCS reception filter having a central frequency of 1842.45 MHz, the allowable parasitic capacitance between the longitudinally-coupled-resonator surface acoustic wave filters and the surface acoustic wave resonators is up to about 0.35 pF in order to provide a filter having a desired insertion loss.

The upper limit of the allowable parasitic capacitance for a center frequency that is used is generally determined by dividing the value $1842.5 \times 0.35 \approx 6.5 \times 10^2$ by the center frequency (MHz). Hence, the allowable parasitic capacitance is about $6.5 \times 10^2/f_0$ (pF) or less, where $f_0$ represents the center frequency (MHz) within the pass band of a longitudinally-coupled-resonator surface acoustic wave filter.

Figure 11:
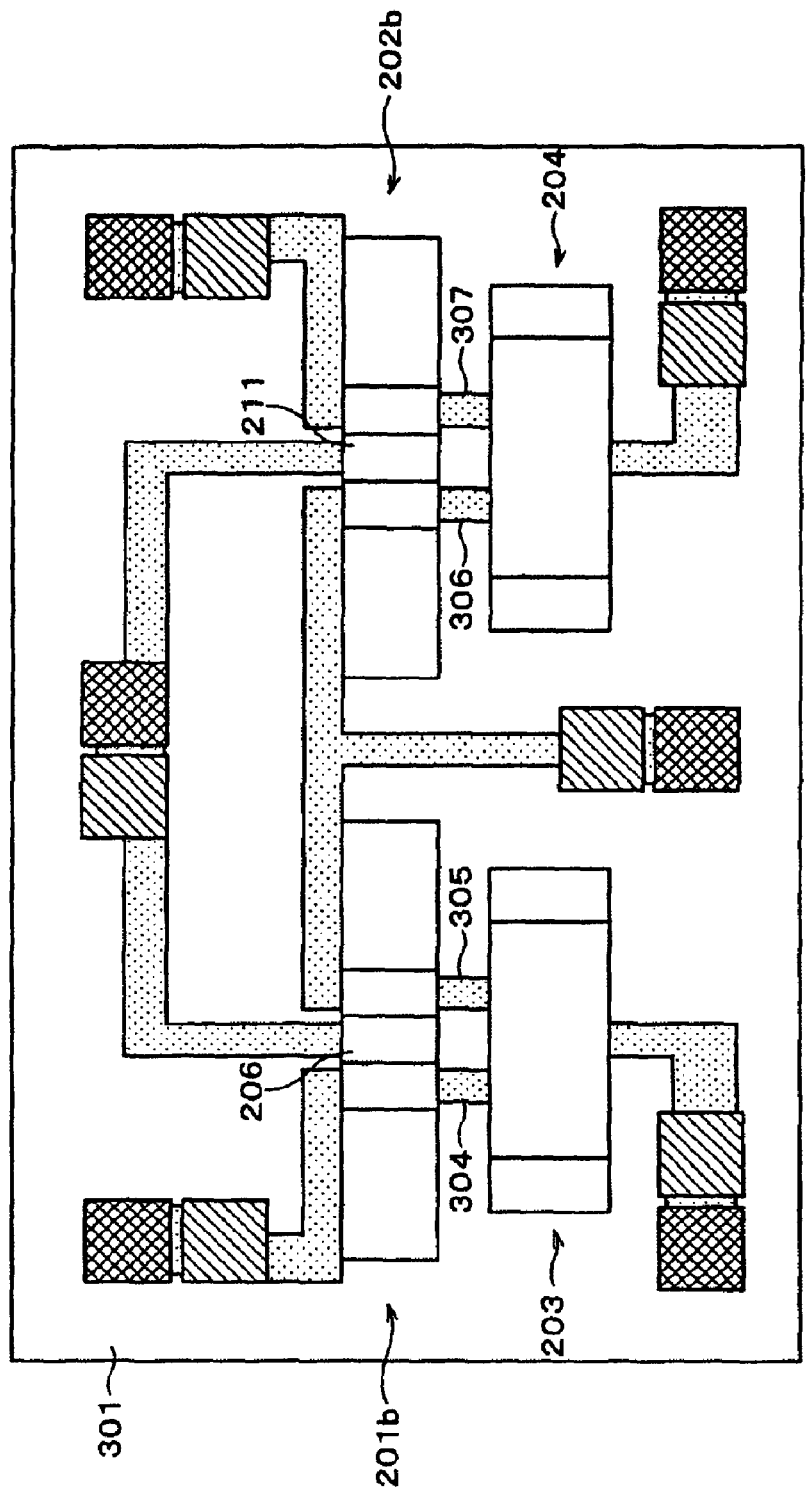
FIG. 11 is a plan view schematically showing the layout of the surface acoustic wave apparatus of the first preferred embodiment on the piezoelectric substrate where bump-bonding electrode pads between the longitudinally-coupled-resonator surface acoustic wave filters and the surface acoustic wave resonators are removed.

The parasitic capacitance between the longitudinally-coupled-resonator surface acoustic wave filters and the surface acoustic wave resonators is reduced by removing the characteristic selection pad in the first preferred embodiment and by connecting the ground terminals of the IDTs 206 and 211 to the ground terminals of the adjacent IDTs on both sides through the electrode fingers shown in FIG. 2. Furthermore, longitudinally-coupled-resonator surface acoustic wave filters 201b and 202b having no bump-bonding electrode pads 302 and 303 in FIG. 1 can be used to reduce the parasitic capacitance, as shown in FIG. 11. Also in this case, since the ground terminals of the IDTs 206 and 211 are connected to the ground terminals of the adjacent IDTs on both sides through the electrode fingers, characteristic selection in a wafer form is achieved.

Figure 12:
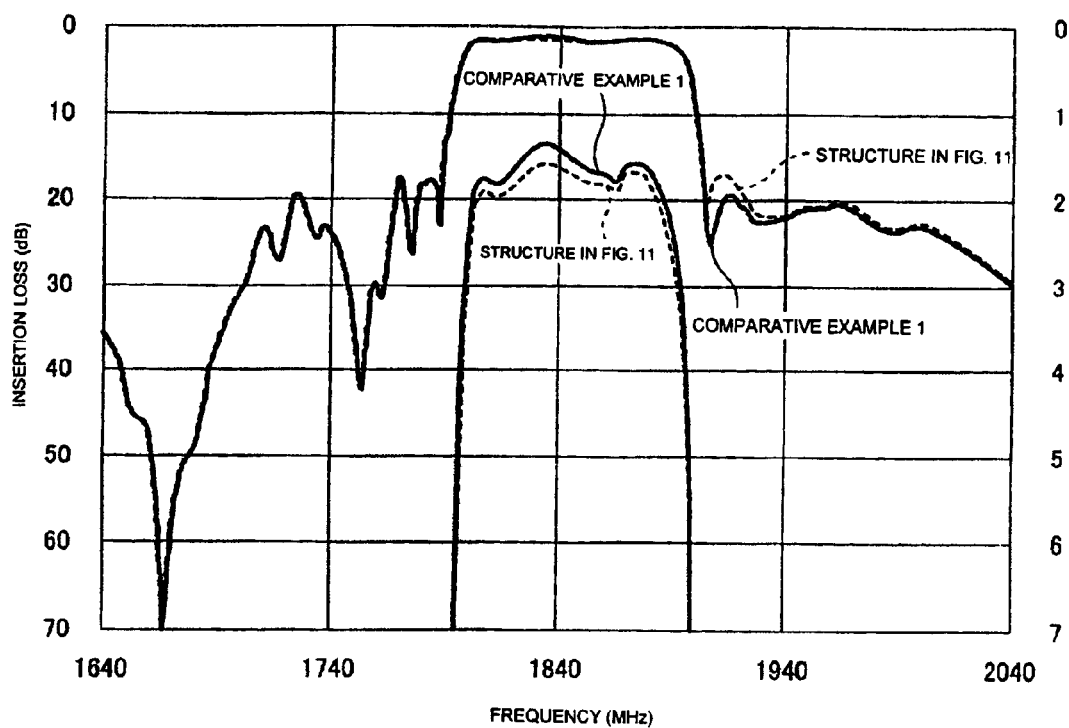
FIG. 12 is a graph showing the frequency-transmission characteristics of the structures in FIG. 11 and Comparative example 1.

However, when the bump-bonding electrode pads 302 and 303 are removed, as shown in FIG. 11, ohmic loss is increased because the IDTs 206 and 211 are weakly grounded. Thus, the insertion loss is increased as compared with Comparative Example 1, as shown in FIG. 12. In other words, either the bump-bonding electrode pad or a wire-boding electrode pad is desirably connected to each of the IDTs 206 and 211, as shown in FIG. 1, in order to achieve the best insertion loss.

In the surface acoustic wave apparatus of the first preferred embodiment described above, which includes the two longitudinally-coupled-resonator surface acoustic wave filters to which the surface acoustic wave resonators are connected in series to provide the balanced-to-unbalanced conversion function, the removal of the characteristic selection pads connected to the ground terminals of the center IDTs for reducing the parasitic capacitance between the longitudinally-coupled-resonator surface acoustic wave filters and the surface acoustic wave resonators greatly improves the insertion loss within the pass band and the VSWR. Furthermore, the connection of the ground terminals of the center IDTs to the ground terminals of the adjoining IDTs on both sides enables characteristic selection in the wafer form even without the characteristic selection pads connected to the ground terminals of the center IDTs.

Figure 13:
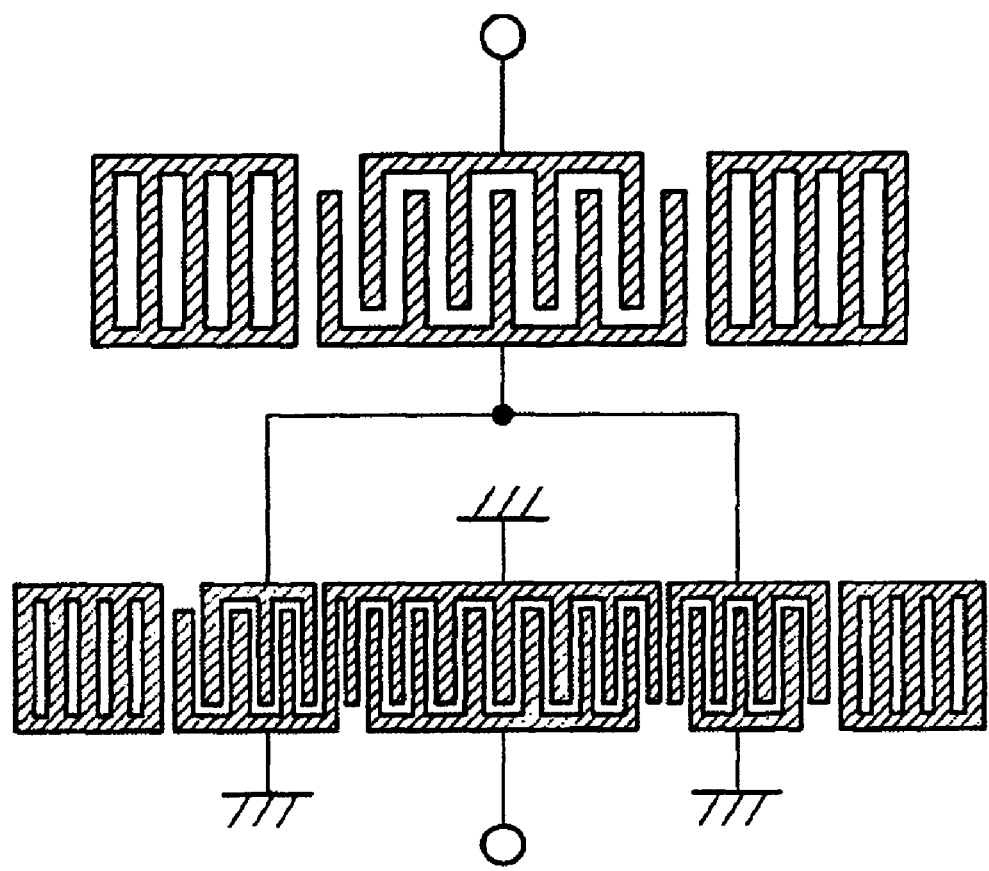
FIG. 13 shows the structure of a modification of the surface acoustic wave apparatus of the first preferred embodiment of the present invention.
Figure 14:
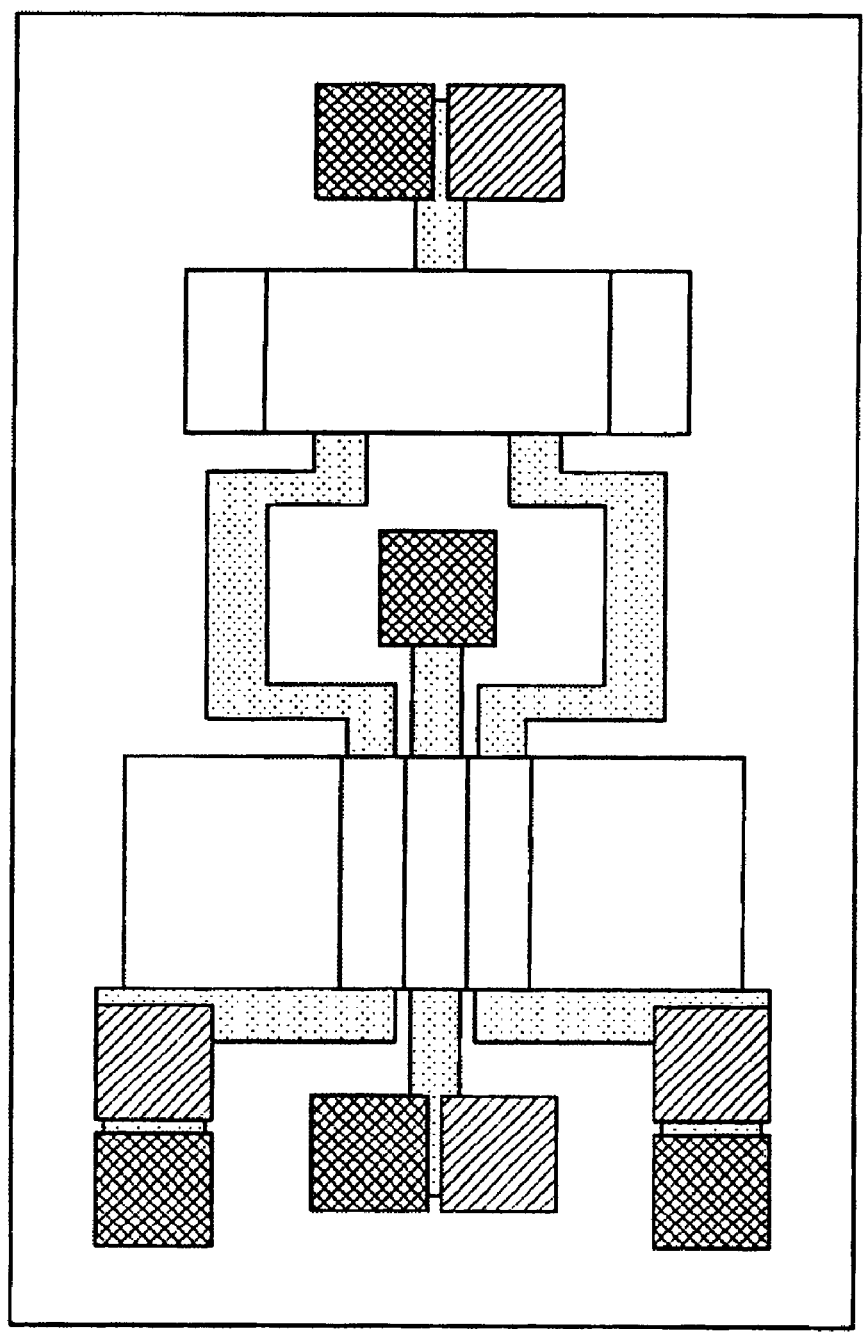
FIG. 14 is a plan view schematically showing the layout of the surface acoustic wave apparatus in FIG. 13 on a piezoelectric substrate.

Also, in a surface acoustic wave apparatus having no balanced-to-unbalanced conversion function in FIG. 13, in addition to the surface acoustic wave apparatus having the balanced-to-unbalanced conversion function of the first preferred embodiment, the removal of the characteristic selection pad connected to the ground terminal of the center IDT of the longitudinally-coupled-resonator surface acoustic wave filter, as shown in FIG. 14, reduces the parasitic capacitance between the longitudinally-coupled-resonator surface acoustic wave filter and the surface acoustic wave resonator, thus, greatly improving the insertion loss within the pass band.

Figure 15:
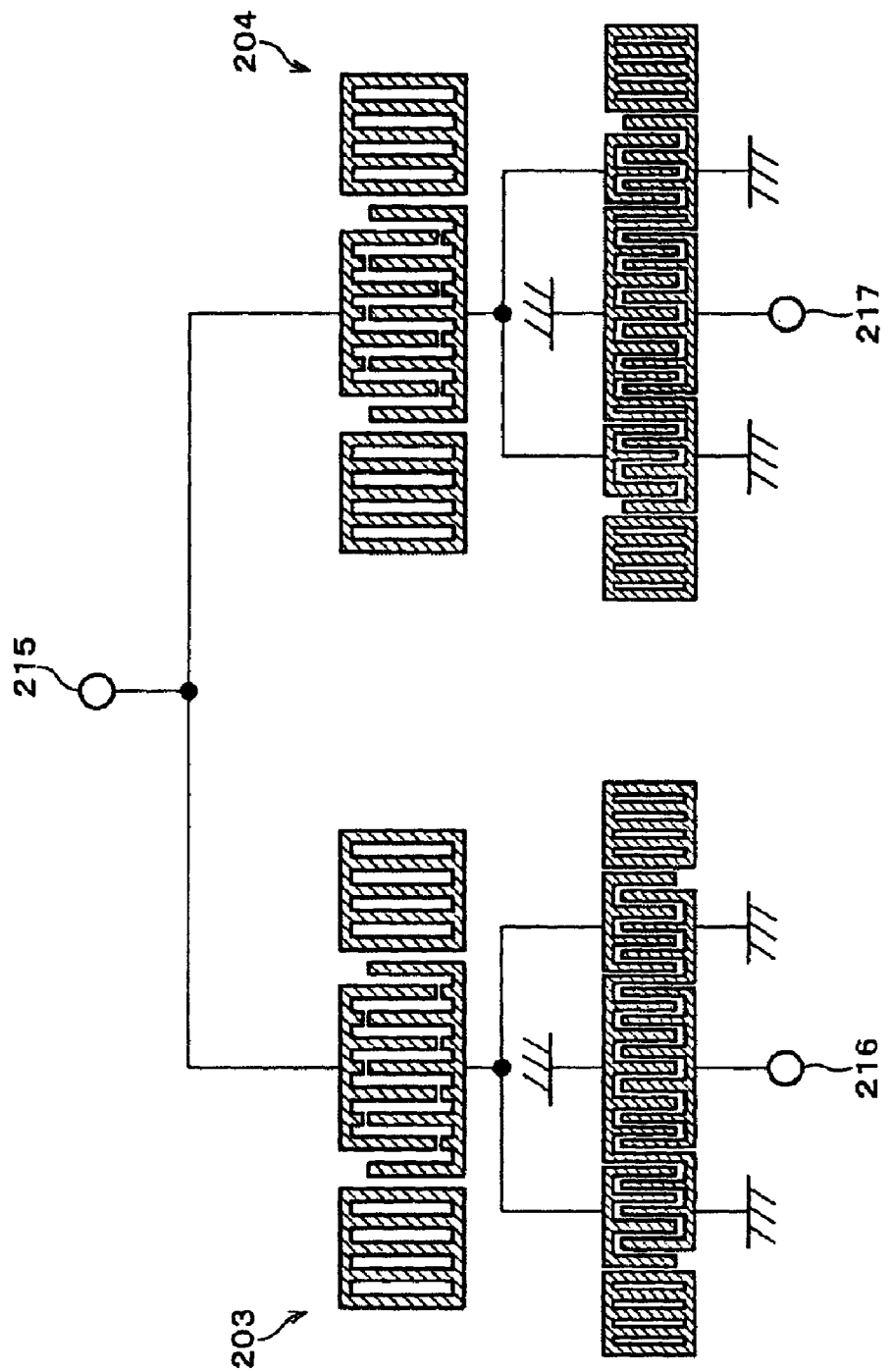
FIG. 15 shows the structure of another modification of the surface acoustic wave apparatus of the first preferred embodiment of the present invention.
Figure 16:
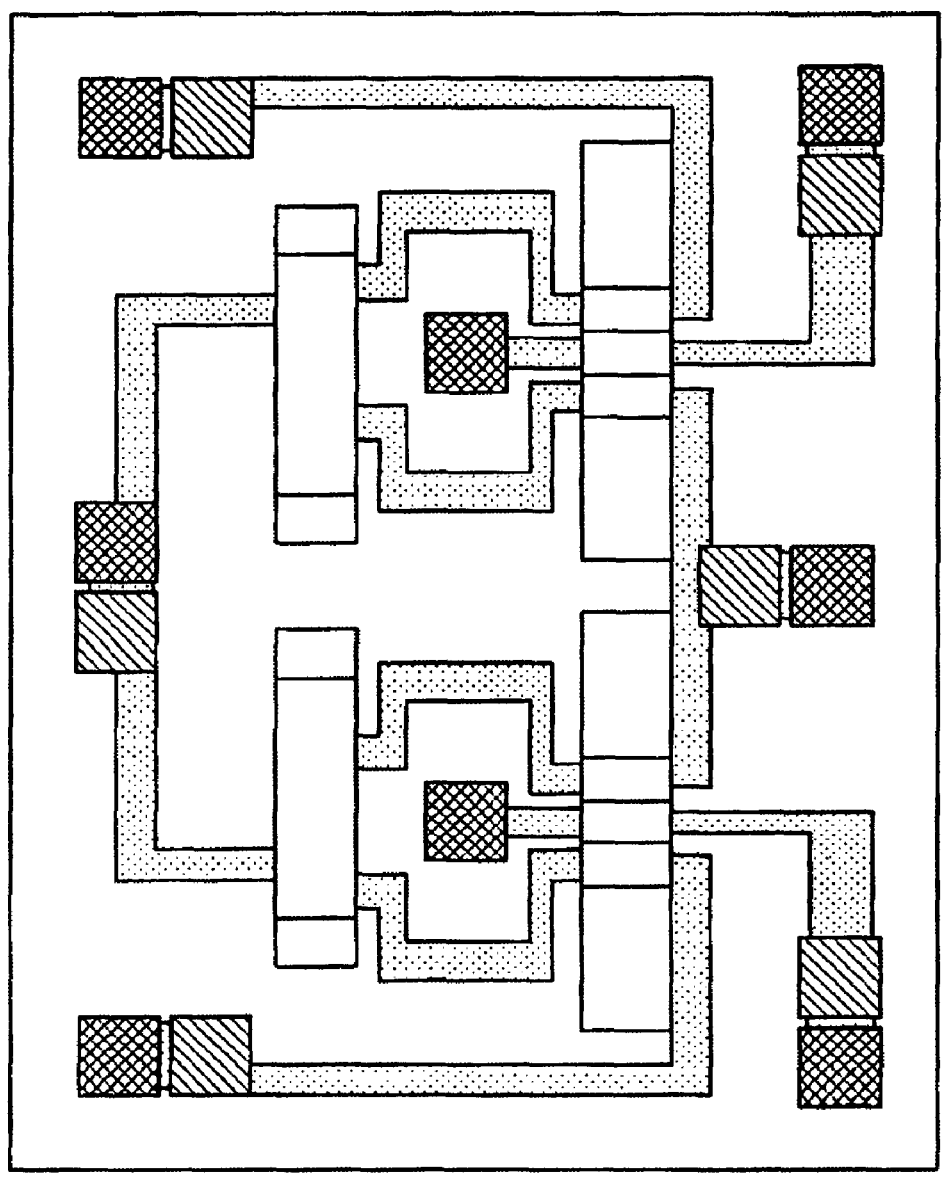
FIG. 16 is a plan view schematically showing the layout of the surface acoustic wave apparatus in FIG. 15 on a piezoelectric substrate.

Also in a surface acoustic wave apparatus including the balanced-to-unbalanced conversion function and a structure inverted with respect to that in FIG. 2, in which the IDTs on both sides are connected to the unbalanced signal terminal 215 and the center IDTs are connected to the balanced signal terminals 216 and 217, as shown in FIG. 15, the removal of the characteristic selection pads connected to the ground terminals of the center IDTs of the longitudinally-coupled-resonator surface acoustic wave filters, as shown in FIG. 16, reduces the parasitic capacitance between the longitudinally-coupled-resonator surface acoustic wave filters and the surface acoustic wave resonators, thus, greatly improving the insertion loss within the pass band.

Figure 17:
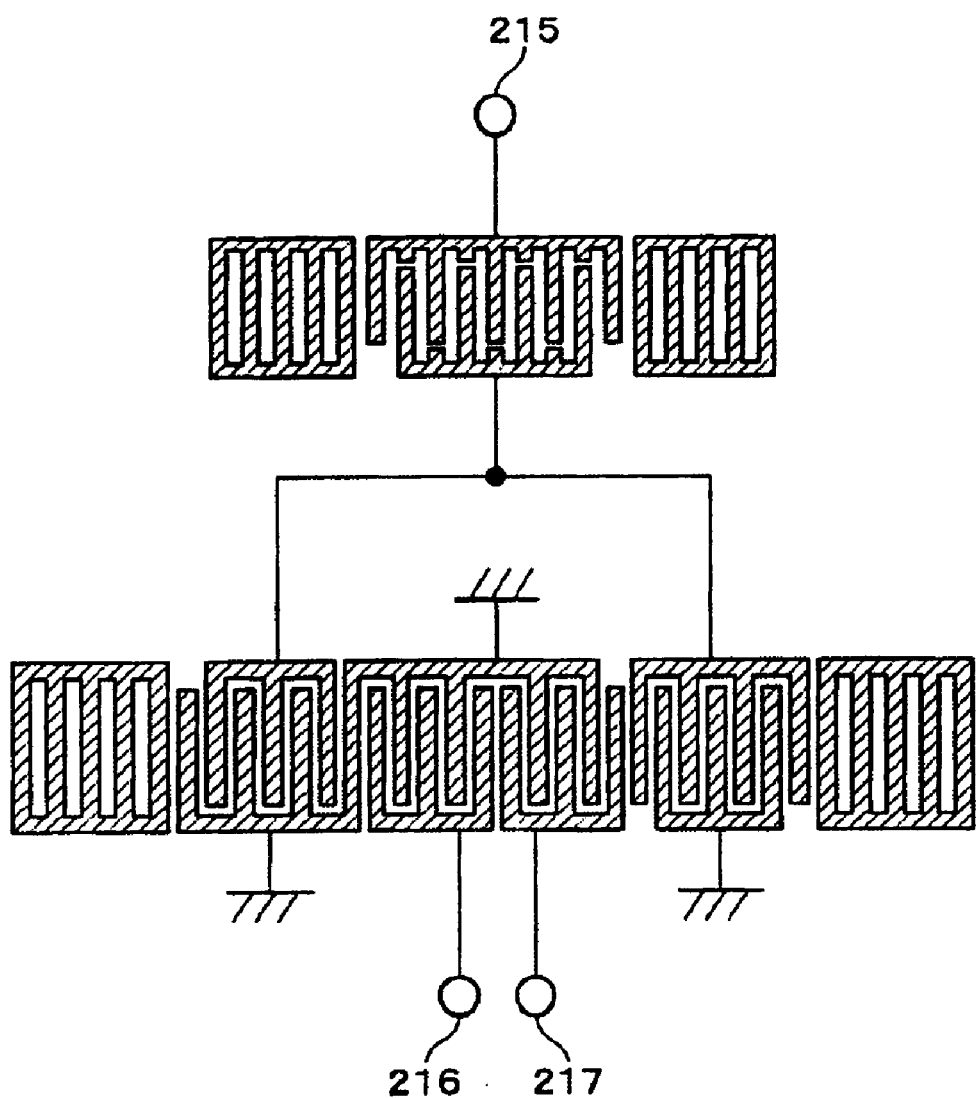
FIG. 17 shows the structure of another modification of the surface acoustic wave apparatus of the first preferred embodiment of the present invention.
Figure 18:
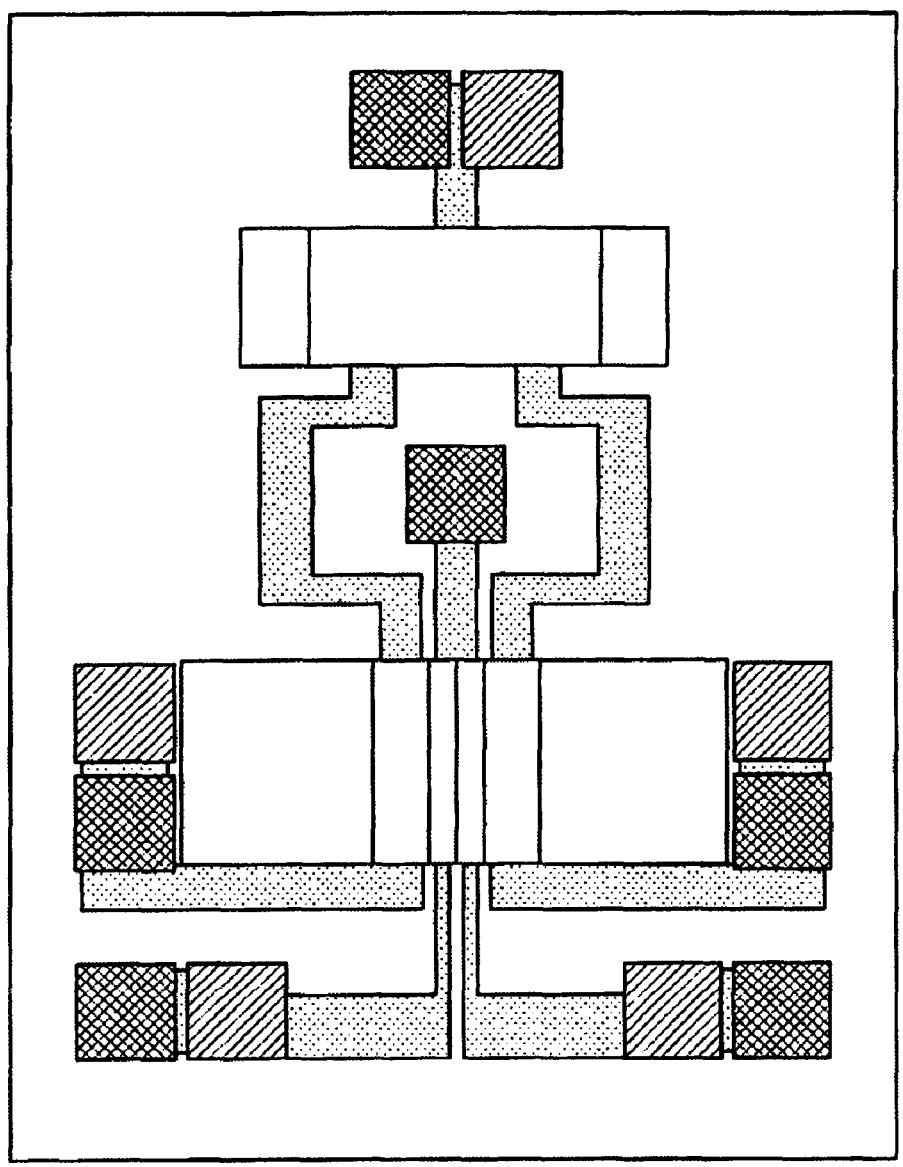
FIG. 18 is a plan view schematically showing the layout of the surface acoustic wave apparatus in FIG. 17 on a piezoelectric substrate.

Furthermore, in a surface acoustic wave apparatus including the balanced-to-unbalanced conversion function by using one longitudinally-coupled-resonator surface acoustic wave filter and splitting the signals from the center IDT into two in the propagation direction of the surface acoustic waves, as shown in FIG. 17, the removal of the characteristic selection pad connected to the ground terminal of the center IDT of the longitudinally-coupled-resonator surface acoustic wave filter, as shown in FIG. 18, reduces the parasitic capacitance between the longitudinally-coupled-resonator surface acoustic wave filter and the surface acoustic wave resonator, thus, greatly improving the insertion loss within the pass band.

Although the surface acoustic wave apparatus of the first preferred embodiment is preferably produced by the face-down technique using bump bonding, in which the electrode pads on the piezoelectric substrate 301 are connected to the package 400, as shown in FIG. 5, the surface acoustic wave apparatus may be produced using wire-bonding or other suitable process.

Figure 19:
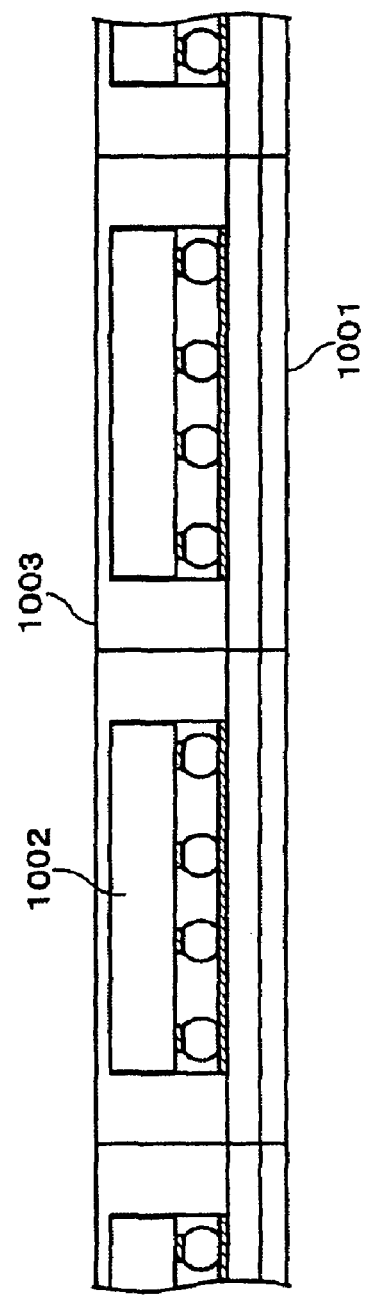
FIG. 19 is a cross-sectional view showing a production process of the surface acoustic wave apparatus of the first preferred embodiment of the present invention.
Figure 20:
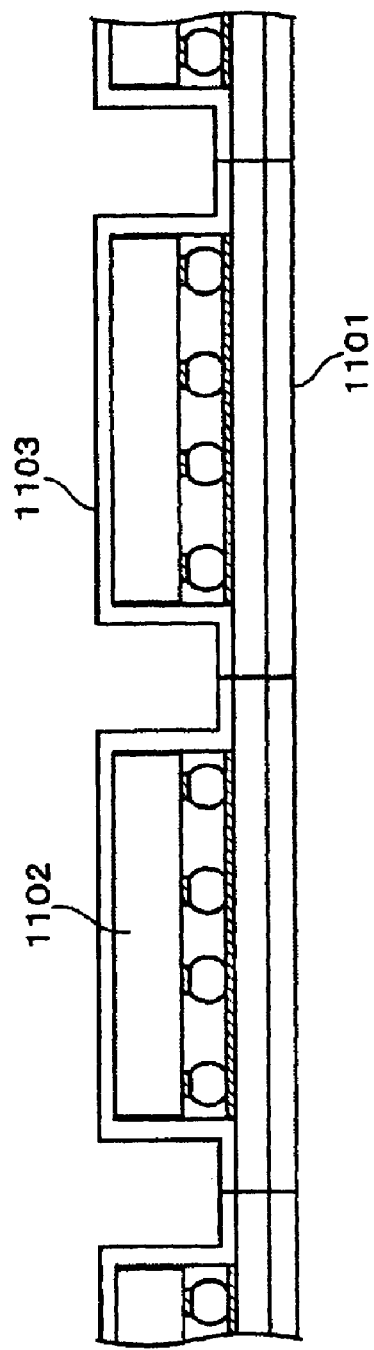
FIG. 20 is a cross-sectional view showing another production process of the surface acoustic wave apparatus of the first preferred embodiment of the present invention.

The structure produced by the face-down technique is not limited to the one shown in FIG. 5. The surface acoustic wave apparatus may include, as shown in FIG. 19, a piezoelectric substrate 1002 that is joined to a base assembly 1001 by a flip-chip technique and covered with resin 1003 for sealing, and the base assembly 1001 is separated into packages by dicing. Alternatively, it may include, as shown in FIG. 20, a piezoelectric substrate 1102 that is joined to a base assembly 1101 by a flip-chip technique and covered with sheet resin 1103 for sealing, and the base assembly 1101 is separated into packages by dicing.

Although the first preferred embodiment includes the piezoelectric substrate 301 that is preferably made of X-propagation LiTaO$_3$ that is Y-cut at 40±5°, the present invention is not limited to this structure. A piezoelectric substrate made of X-propagation LiNbO$_3$ that is Y-cut at 64° to 72°, X-propagation LiNbO$_3$ that is Y-cut at 41°, or other suitable materials may be used.

Second Preferred Embodiment

A second preferred embodiment of the present invention will now be described with reference to FIGS. 21 and 22. The electrode structure according to the second preferred embodiment will be described with reference to FIG. 21. A longitudinally-coupled-resonator surface acoustic wave filter 1201 and a surface acoustic wave resonator 1202 that is connected in series to the longitudinally-coupled-resonator surface acoustic wave filter 1201 are provided on a piezoelectric substrate 301 that is preferably made of X-propagation LiTaO$_3$ that is Y-cut at 40±5°. The longitudinally-coupled-resonator surface acoustic wave filter 1201 and the surface acoustic wave resonator 1202 preferably include aluminum electrodes.

In the longitudinally-coupled-resonator surface acoustic wave filter 1201, IDTs 1203 to 1207 that are arranged along the propagation direction of the surface acoustic waves are sandwiched between reflectors 1208 and 1209. Referring to FIG. 21, the spacing between the electrode fingers in areas where two IDTs are adjacent (areas 1210 to 1213 in FIG. 21) is less than the spacing between the electrode fingers in the other areas.

The IDTs 1203, 1205, and 1207 are connected to an unbalanced signal terminal 1214 through the surface acoustic wave resonator 1202. The IDTs 1204 and 1206 are connected to balanced signal terminals 1215 and 1216, respectively. The IDT 1206 has a phase that is inverted with respect to that of the IDT 1204, thus providing the balanced-to-unbalanced conversion function.

In surface acoustic wave resonator 1202, an IDT 1217 is sandwiched between reflectors 1218 and 1219. FIG. 22 shows the layout of the electrode structure of the second preferred embodiment on the piezoelectric substrate 301. The same reference numerals are used in FIG. 22 to identify the same components shown in FIG. 21.

Figure 22:
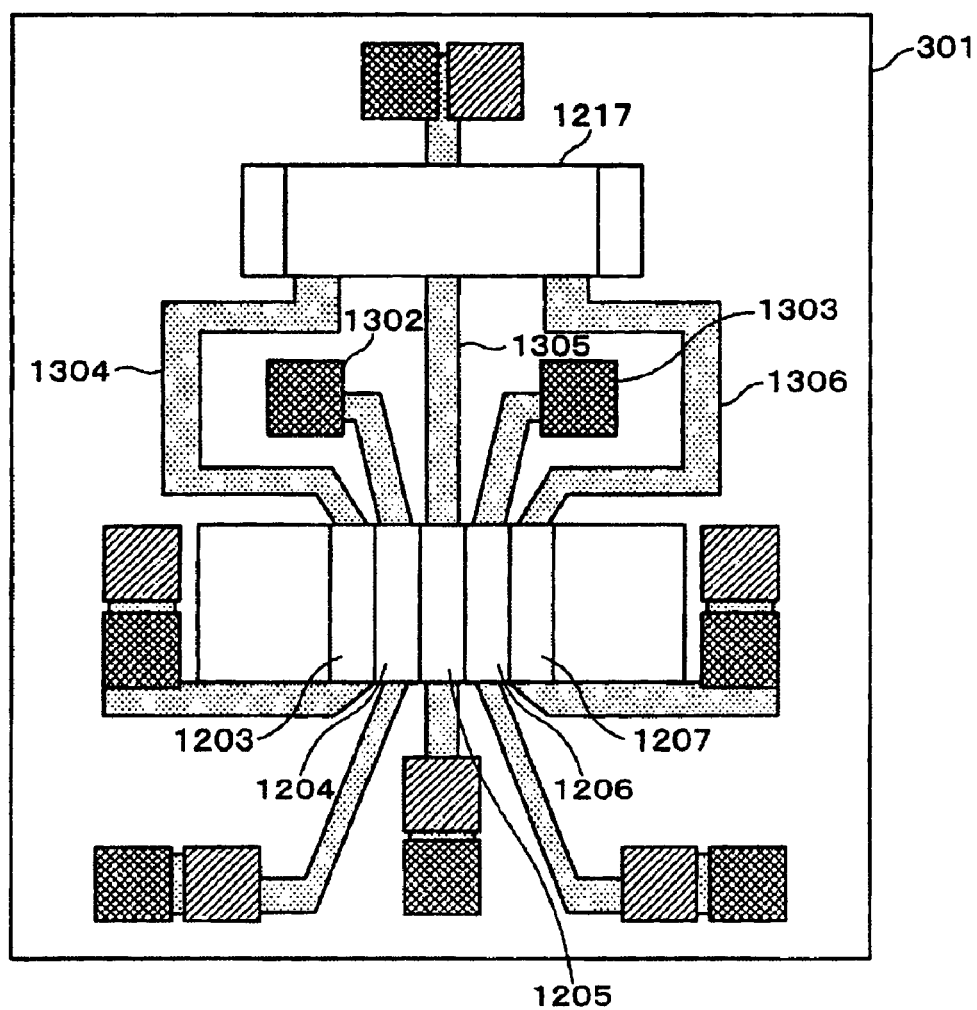
FIG. 22 a plan view schematically showing the layout of the surface acoustic wave apparatus of the second preferred embodiment on a piezoelectric substrate.

In the layout in FIG. 22, bump-bonding electrode pads for connecting the piezoelectric substrate 301 to a package are represented by squares filled with a diagonal grid and selection pads are represented by squares filled with diagonal lines. In the electrode structure of the second preferred embodiment, as shown in FIG. 22, only bump-bonding electrode pads 1302 and 1303 are connected to the ground terminals of the IDTs 1204 and 1206, respectively, and no characteristic selection pads are connected to them. The ground terminal of the IDT 1204 is arranged between a signal line 1304 that connects the IDT 1203 to the IDT 1217 and a signal line 1305 that connects the IDT 1205 to the IDT 1217. The ground terminal of the IDT 1206 is arranged between the signal line 1305 that connects the IDT 1205 to the IDT 1217 and a signal line 1306 that connects the IDT 1207 to the IDT 1217.

Figure 21:
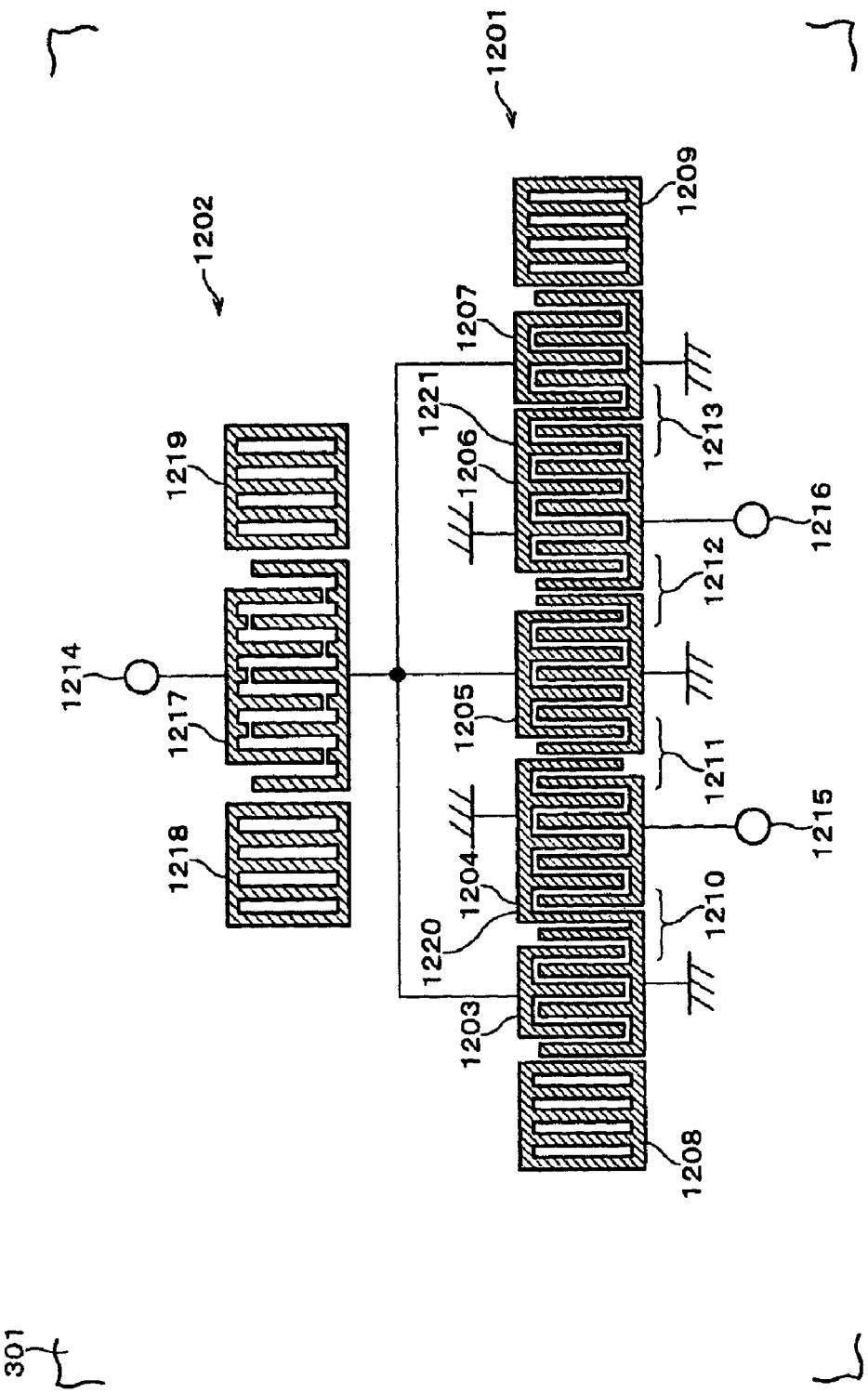
FIG. 21 shows the structure of a surface acoustic wave apparatus of a second preferred embodiment of the present invention.

Accordingly, as shown in FIG. 21, the ground terminal of the IDT 1204 is connected to the ground terminal of the IDT 1203 at a portion 1220 where the IDT 1204 is adjacent to the IDT 1203 through the electrode fingers. The ground terminal of the IDT 1206 is connected to the ground terminal of the IDT 1207 at a portion 1221 where the IDT 1206 is adjacent to the IDT 1207 through the electrode fingers. Hence, the filter characteristics of the surface acoustic wave apparatus can be confirmed in a wafer form without the characteristic selection pads being connected to the ground terminal of the IDT 1204 and the IDT 1206.

The detailed specifications of the longitudinally-coupled-resonator surface acoustic wave filter 1201 are as follows, where λI represents a wavelength determined by the spacing between the electrode fingers that are not arranged at a shorter spacing:

Facing length: about 37.1 λI

Number of IDTs (in the order of IDTs 1203, 1204, 1205, 1206, and 1207): 22 (3)/(3) 31 (3)/(3) 37 (3)/(3) 31 (3)/(3) 22 (the figures in the parentheses indicate the numbers of electrode fingers arranged at the shorter spacing)

Number of reflectors: 60

Duty: about 0.72 (for IDT), about 0.57 (for reflector)

Electrode thickness: about 0.092 λI

The detailed specifications of the surface acoustic wave resonator 1202 are as follows:

Facing length: about 50.7 λI

Number of IDTs: 250

Number of reflectors: 30

Duty: about 0.60

Electrode thickness: about 0.093 λI

Figure 23:
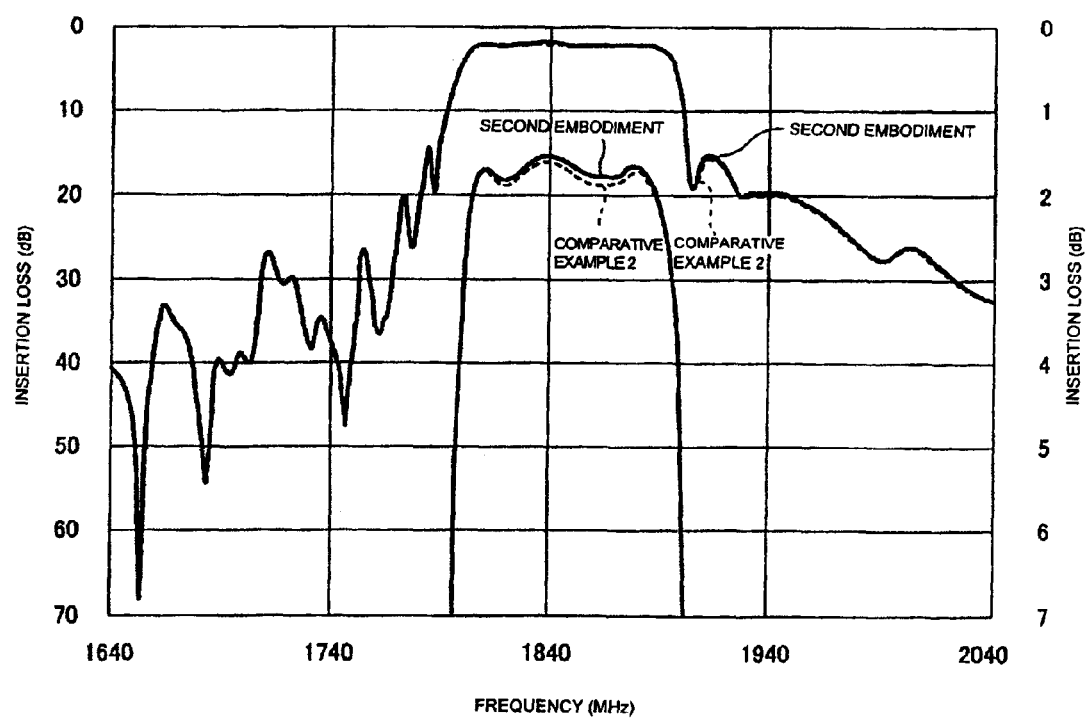
FIG. 23 is a graph showing the frequency-transmission characteristics of the structures of the second preferred embodiment and Comparative example 2.
Figure 24A:
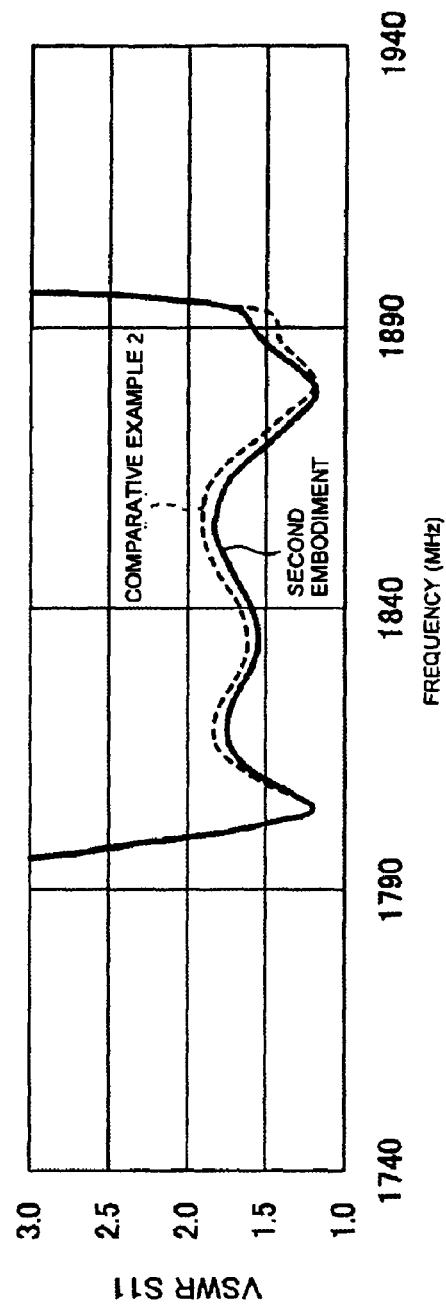
FIG. 24A is a graph showing the frequency-VSWR characteristics for S11 of the structures of the second preferred embodiment and Comparative example 2.
Figure 24B:
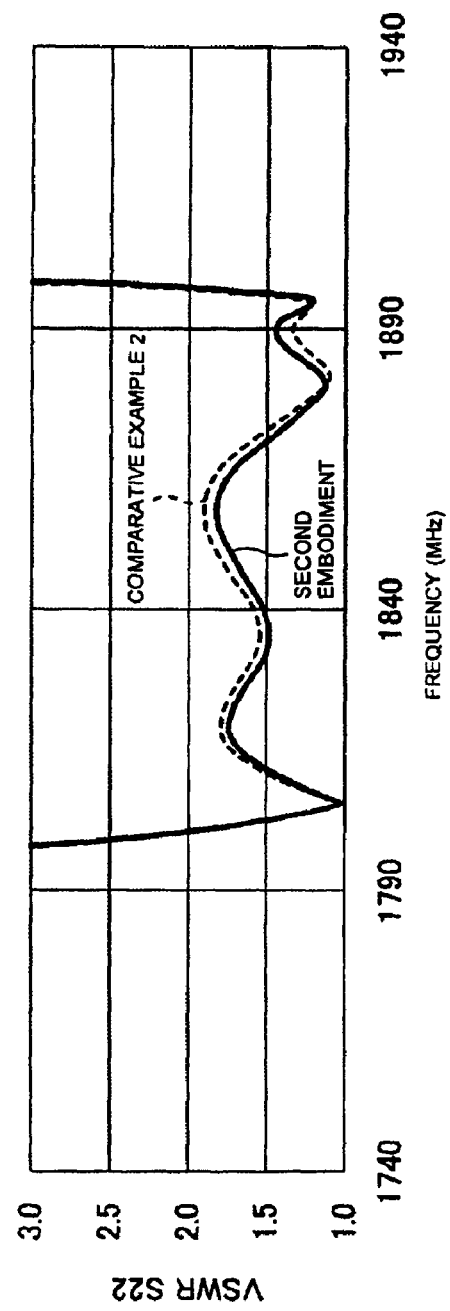
FIG. 24B is a graph showing the frequency-VSWR characteristics for S22 of the structures of the second preferred embodiment and Comparative example 2.
Figure 25:
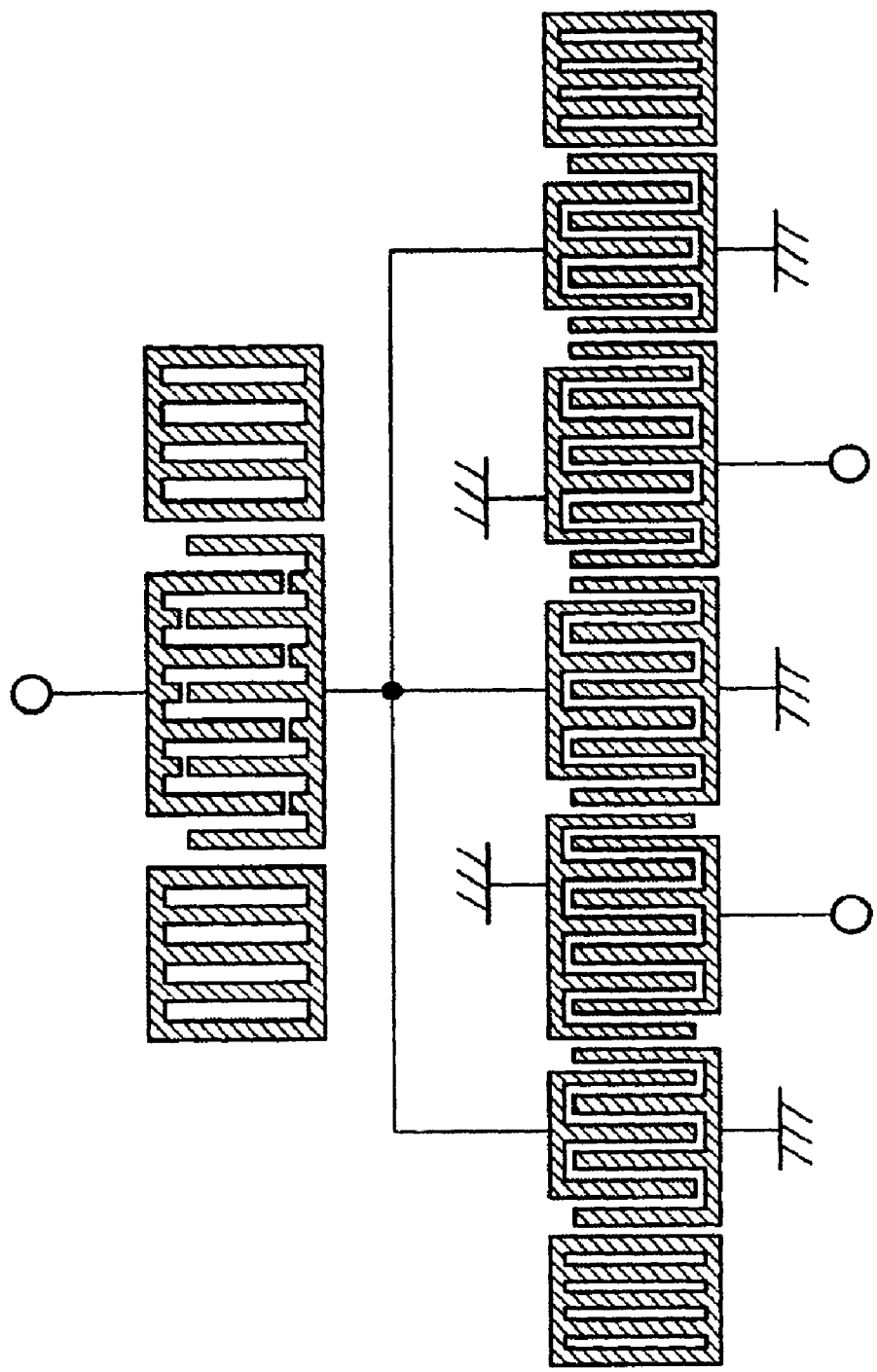
FIG. 25 shows the structure of the surface acoustic wave apparatus of Comparative example 2.
Figure 26:
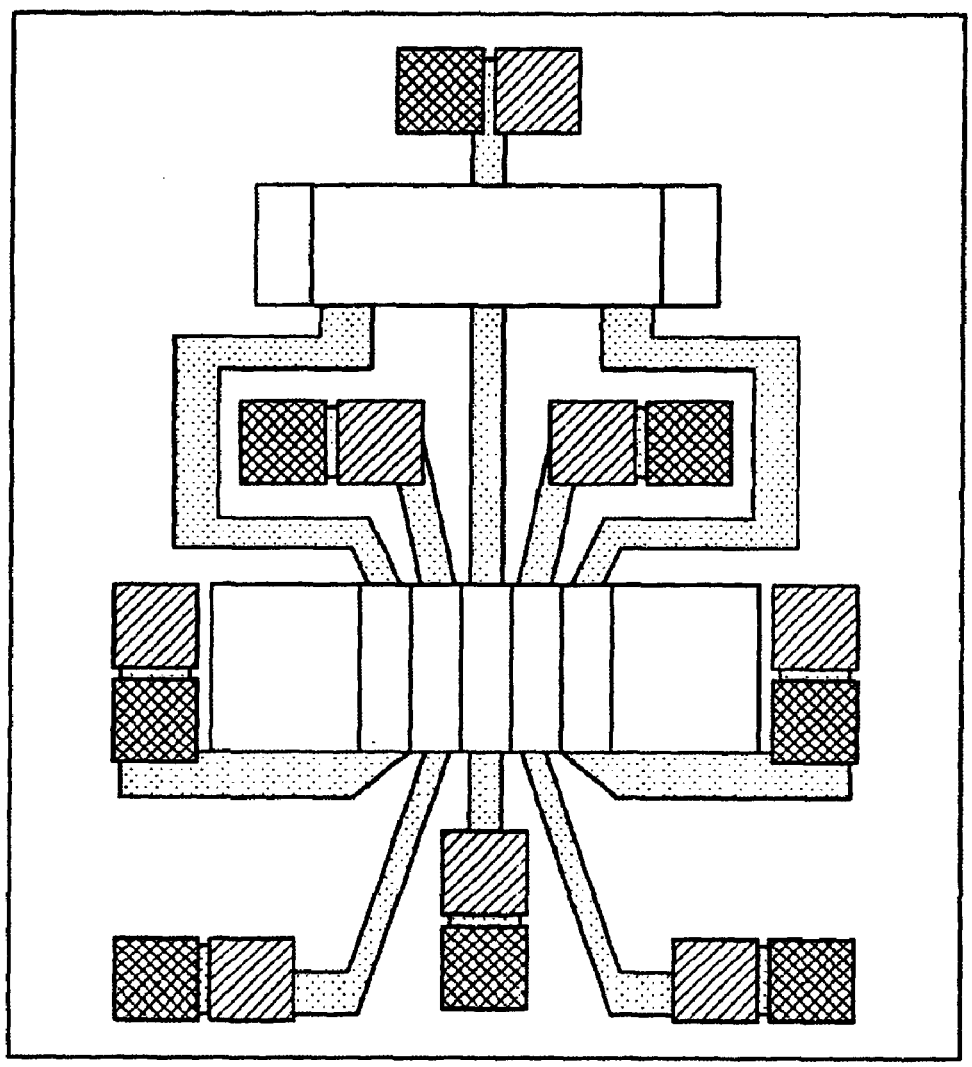
FIG. 26 is a plan view schematically showing the layout of the surface acoustic wave apparatus of Comparative example 2 on a piezoelectric substrate.

Next, the operation and effects of the surface acoustic wave apparatus according to the second preferred embodiment will be described. FIG. 23 shows the frequency-transmission characteristics of the structure of the second preferred embodiment. FIGS. 24A and 24B show the frequency-VSWR characteristics of the second preferred embodiment. For comparison, the frequency-transmission characteristics and the frequency-VSWR characteristics of the structure of Comparative Example 2 shown in FIGS. 25 and 26 are also shown in FIGS. 23, 24A, and 24B.

In the Comparative Example 2, the respective characteristic selection pads are connected to the ground terminals of the IDTs 1204 and 1206, and the ground terminal of the IDT 1203 is separated from the ground terminal of the IDT 1204 and the ground terminal of the IDT 1206 is separated from the ground terminal of the IDT 1207. All of the other design parameters in Comparative Example 2 are the same as those in the second preferred embodiment.

Figure 27:
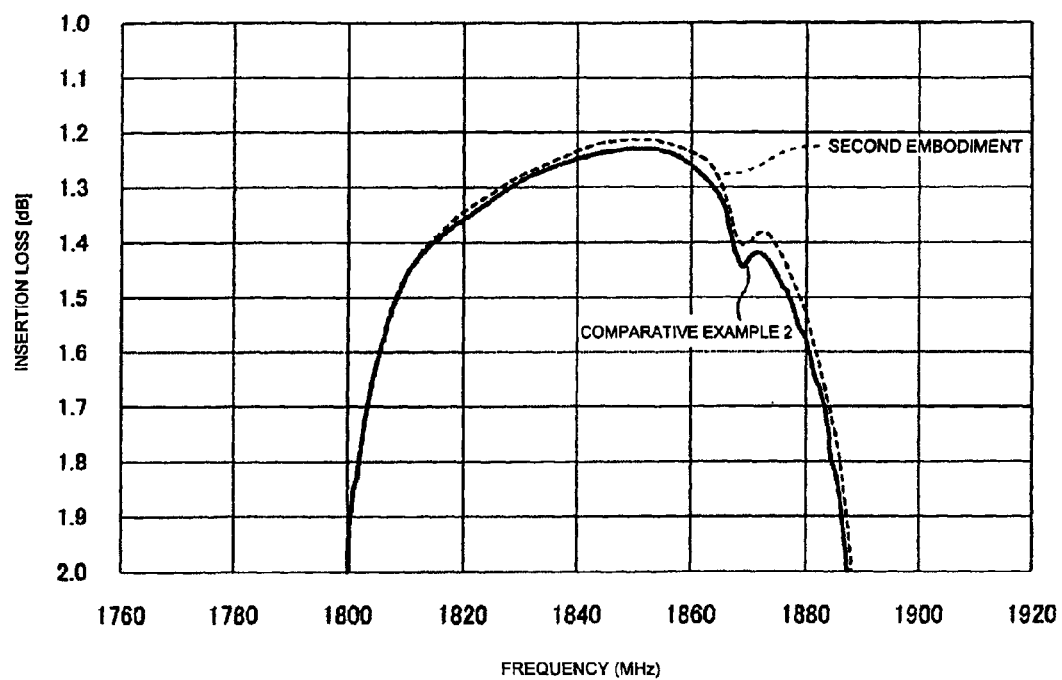
FIG. 27 is a graph showing the frequency-transmission characteristics in a case in which the mismatching loss is removed from the frequency-transmission characteristics in the second preferred embodiment and Comparative example 2.

Referring to FIGS. 23, 24A, and 24B, both the frequency-transmission characteristics and the frequency-VSWR characteristics in the second preferred embodiment are better than those in Comparative Example 2. FIG. 27 shows the frequency-transmission characteristics in a case in which the mismatching loss is removed, by simulation, from the frequency-transmission characteristics in the second preferred embodiment and Comparative Example 2. Referring to FIG. 27, the insertion loss in the second preferred embodiment is less than that in Comparative Example 2.

Also in the second preferred embodiment in which the five IDTs 1203 to 1207 are used, the reduction in parasitic capacitance between the longitudinally-coupled-resonator surface acoustic wave filter and the surface acoustic wave resonator decreases not only the mismatching loss but also other factors causing the insertion loss, as in the first preferred embodiment, thus, providing greatly improved insertion loss within the pass band.

In the surface acoustic wave apparatus of the second preferred embodiment described above, which includes the longitudinally-coupled-resonator surface acoustic wave filter, having the five IDTs, to which the surface acoustic wave resonator is connected in series to provide the balanced-to-unbalanced conversion function, the reduction in parasitic capacitance between the longitudinally-coupled-resonator surface acoustic wave filter and the surface acoustic wave resonator greatly improves the insertion loss within the pass band and the VSWR.

Figure 28:
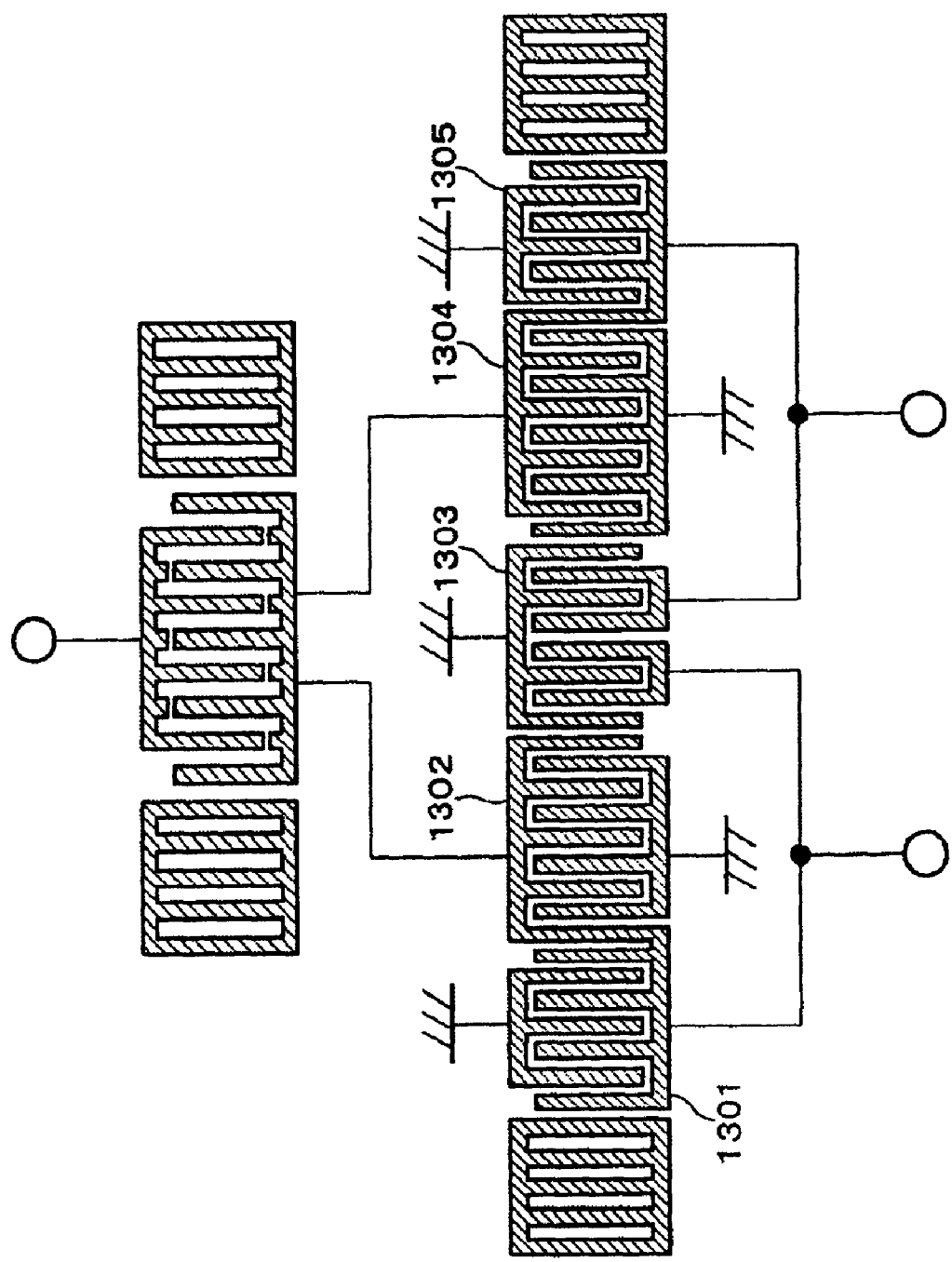
FIG. 28 shows the structure of a modification of the surface acoustic wave apparatus of the second preferred embodiment of the present invention.
Figure 29:
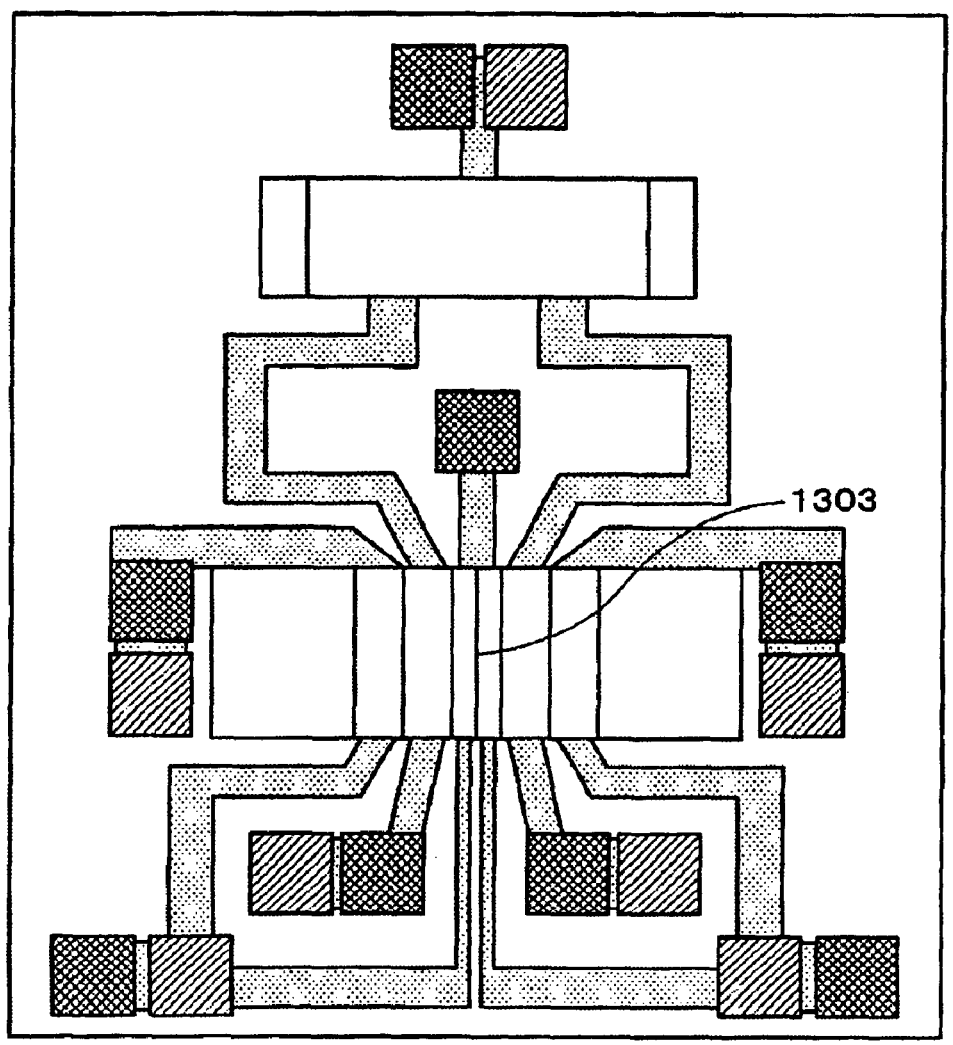
FIG. 29 is a plan view schematically showing the layout of the surface acoustic wave apparatus in FIG. 28 on a piezoelectric substrate.

In addition to the surface acoustic wave apparatus of the second preferred embodiment in FIG. 21 which provides the balanced-to-unbalanced conversion function by connecting the IDTs 1204 and 1206 to the balanced signal terminals 1215 and 1216, respectively, also in a surface acoustic wave apparatus in FIG. 28 in which signals from the center IDT 1303 are separated into two in the propagation direction of the surface acoustic waves and the IDTs 1301, 1303, and 1305 are connected to the balanced signal terminals, the removal of the characteristic selection pads connected to the ground terminal of the IDT 1303, as shown in FIG. 29, reduces the parasitic capacitance between the longitudinally-coupled-resonator surface acoustic wave filter and the surface acoustic wave resonator, thus, greatly improving the insertion loss within the pass band.

Third Preferred Embodiment

Figure 30:
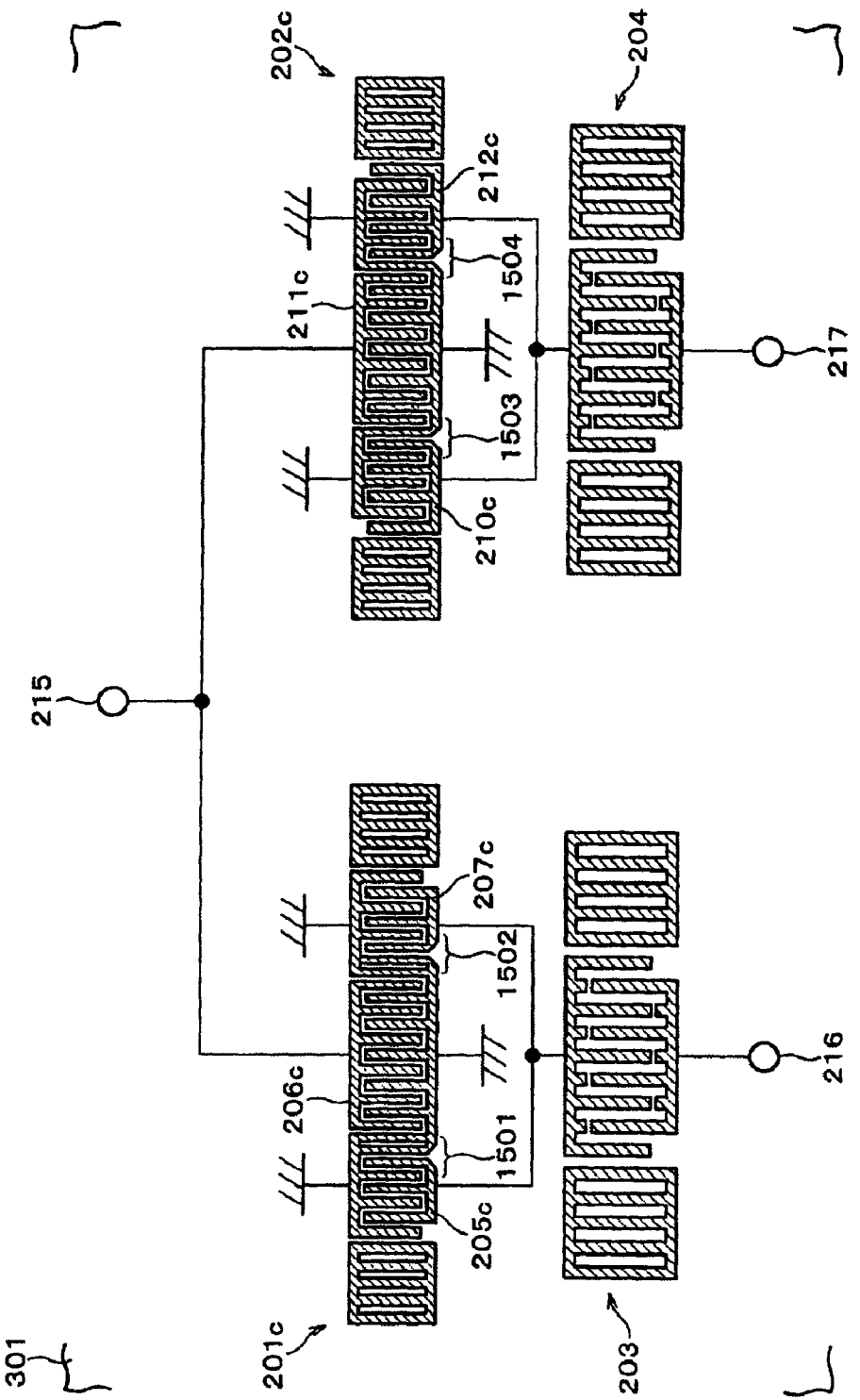
FIG. 30 shows the structure of a surface acoustic wave apparatus of a third preferred embodiment of the present invention.

FIG. 30 shows a third preferred embodiment of the present invention. In the structure in FIG. 30 having a similar structure to that of the first preferred embodiment, the bus bars of IDTs 205c, 206c, 207c, 210c, 211c, and 212c are configured so as to be thinner, than in the other areas, in areas (areas 1501 to 1504 in FIG. 30) where signal electrodes are adjacent to the corresponding ground electrodes and the parasitic capacitance occurs between longitudinally-coupled-resonator surface acoustic wave filters 201c and 202c and the corresponding surface acoustic wave resonators 203 and 204.

In other words, in the bus bars of the IDTs 205c, 206c, 207c, 210c, 211c, and 212c, the spacing between the signal electrodes and the corresponding ground electrodes is gradually widened outward (in the outward direction orthogonal to the propagation direction of the surface acoustic waves) at the corners on the side near to the surface acoustic wave resonators 203 and 204, where the signal electrodes are adjacent to the corresponding ground electrodes. The decreased length in the bus bars is preferably greater than the width of the electrode fingers connected to the bus bars. Although the spacing may be widened linearly or in a curved manner, the spacing is preferably widened in a curved manner to improve the strength and manufacturability of the IDTs.

Next, the operation and effects of the surface acoustic wave apparatus according to the third preferred embodiment will be described. In FIG. 30, the parasitic capacitance between the longitudinally-coupled-resonator surface acoustic wave filters 201c and 202c and the corresponding surface acoustic wave resonators 203 and 204 is reduced more than that in the first preferred embodiment, thus, further improving the insertion loss within the pass band.

Fourth Preferred Embodiment

Figure 31:
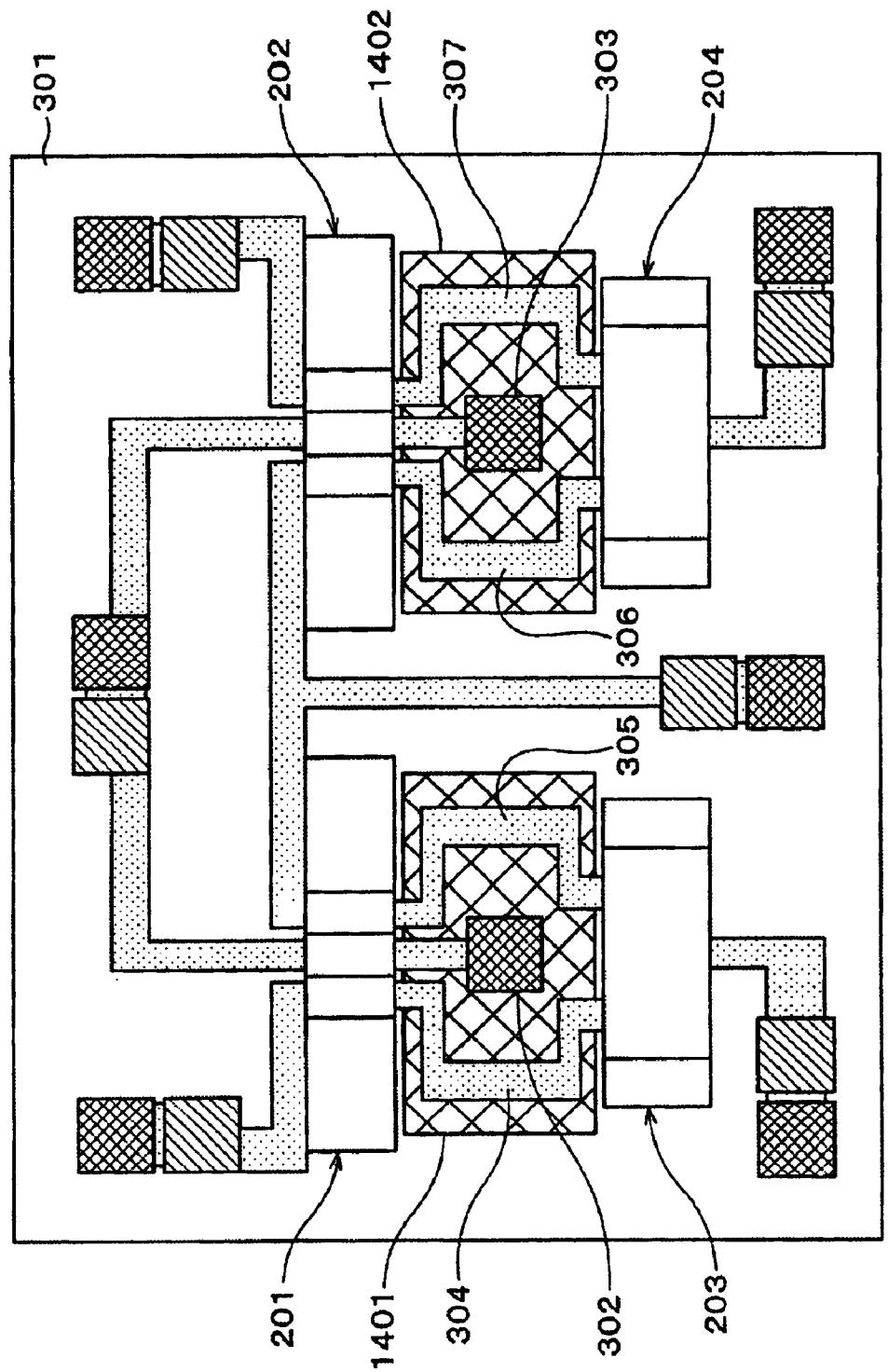
FIG. 31 shows a plan view schematically showing the layout of a surface acoustic wave apparatus according to a fourth preferred embodiment of the present invention.

FIG. 31 shows a surface acoustic wave apparatus according to a fourth preferred embodiment of the present invention. In the surface acoustic wave apparatus of the fourth preferred embodiment, which has similar structure to the first preferred embodiment, an insulating layer 1401 having a smaller relative dielectric constant than that of the piezoelectric substrate 301 is provided in a first area that is between the longitudinally-coupled-resonator surface acoustic wave filter 201 and the corresponding surface acoustic wave resonator 203, and an insulating layer 1402 having a smaller relative dielectric constant than that of the piezoelectric substrate 301 is provided in a second area that is between the longitudinally-coupled-resonator surface acoustic wave filter 202 and the corresponding surface acoustic wave resonator 204. The first area is between the piezoelectric substrate 301 and the signal lines 304 and 305 that connect the longitudinally-coupled-resonator surface acoustic wave filter 201 to the surface acoustic wave resonator 203 and the bump-bonding electrode pad 302. The second area is between the piezoelectric substrate 301 and the signal lines 306 and 307 that connect the longitudinally-coupled-resonator surface acoustic wave filter 202 to the surface acoustic wave resonator 204 and the bump-bonding electrode pad 303.

In other words, in the surface acoustic wave apparatus of the fourth preferred embodiment, the insulating layer 1401 is provided between the piezoelectric substrate 301, and at least one of the bump-bonding electrode pad 302 connected to the ground terminal of the IDT that is at the side to which the surface acoustic wave resonator 203 is connected, the ground line that connects the ground terminal of the IDT to the bump-bonding electrode pad 302, and the signal lines 304 and 305 that connect the longitudinally-coupled-resonator surface acoustic wave filter 201 to the surface acoustic wave resonator 203. The insulating layer 1402 is provided between the piezoelectric substrate 301, and at least one of the bump-bonding electrode pad 303 connected to the ground terminal of the IDT that is at the side to which the surface acoustic wave resonator 204 is connected, the ground line that connects the ground terminal of the IDT to the bump-bonding electrode pad 303, and the signal lines 306 and 307 that connect the longitudinally-coupled-resonator surface acoustic wave filter 202 to the surface acoustic wave resonator 204.

Figure 32:
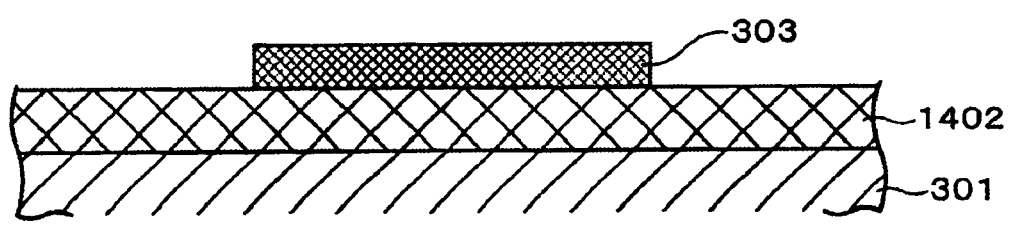
FIG. 32 is a cross-sectional view of the surface acoustic wave apparatus of the fourth preferred embodiment in an area where the surface acoustic wave apparatus has insulating layers.

FIG. 32 is a sectional view of the second area described above. The insulating layer 1402 is provided on the piezoelectric substrate 301. The signal lines 306 and 307 and the bump-bonding electrode pad 303 are provided on the insulating layer 1402. The insulating layers 1401 and 1402 are made of, for example, photosensitive resin such as photosensitive polyimide, $SiO_2$, or SiN, or other suitable material.

Next, the operation and effects of the surface acoustic wave apparatus according to the fourth preferred embodiment will be described. The insulating layers 1401 and 1402 between the piezoelectric substrate 301 and the signal lines 304 to 307, as shown in FIG. 31, reduce the parasitic capacitance between the longitudinally-coupled-resonator surface acoustic wave filters 201 and 202 and the corresponding surface acoustic wave resonators 203 and 204 because the relative dielectric constant of the insulating layers 1401 and 1402 is less than that of the piezoelectric substrate 301. Accordingly, the surface acoustic wave apparatus of the fourth preferred embodiment has further improved insertion loss within the pass band, compared with the surface acoustic wave apparatus of the first preferred embodiment of the present invention.

Although the operation and effects of each of the structures according to the first to fourth preferred embodiments are described, any combination of the structures according to the first to fourth preferred embodiments may be utilized.

Fifth Preferred Embodiment

Figure 34:
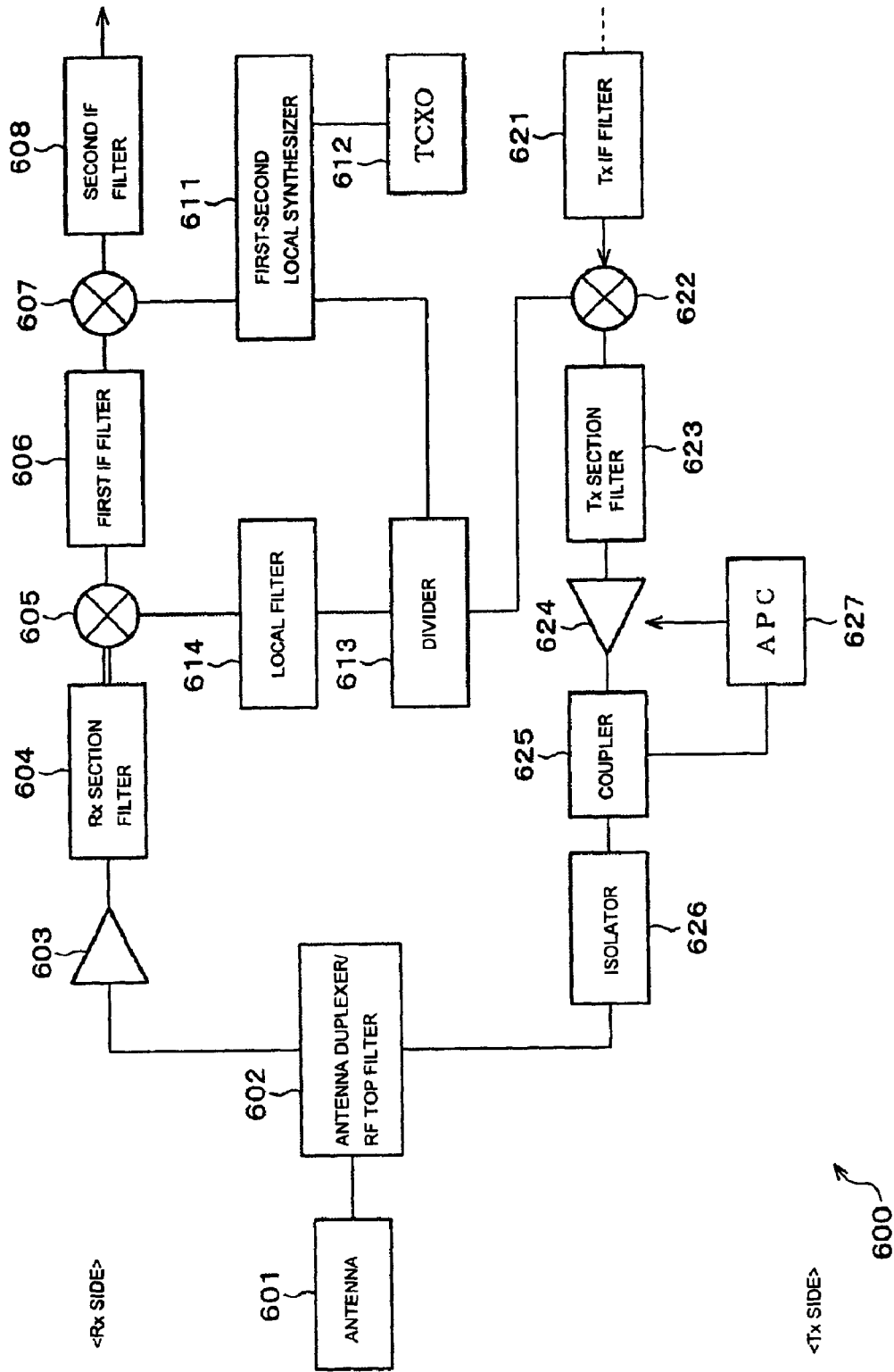
FIG. 34 is a block diagram of the main portion of a communication apparatus including any of the surface acoustic wave apparatuses according to preferred embodiments of the present invention.

A communication apparatus 600 including any of the surface acoustic wave apparatuses of the first to fourth preferred embodiments of the present invention will now be described with reference to FIG. 34. Referring to FIG. 34, the communication apparatus 600 preferably includes, at the receiver side (Rx side), an antenna 601, an antenna duplexer/RF Top filter 602, a first amplifier 603, a receiver section filter 604, a first mixer 605, a first IF filter 606, a second mixer 607, a second IF filter 608, a first-second local synthesizer 611, a temperature compensated crystal oscillator (TCXO) 612, a divider 613, and a local filter 614.

Balanced signals are preferably sent from the receiver section filter 604 to the first mixer 605 to maintain balance, as shown by a double line in FIG. 34.

The communication apparatus 600 includes, at the transmitter side (Tx side), the antenna 601 and the antenna duplexer/RF Top filter 602, which are used in common with the receiver side, a transmitter IF filter 621, a third mixer 622, a transmitter section filter 623, a second amplifier 624, a coupler 625, an isolator 626, and an automatic power control (APC) 627.

The surface acoustic wave apparatus according to any of the first to fourth preferred embodiments described above or any combined surface acoustic wave apparatus used for the receiver section filter 604, the first IF filter 606, the transmitter IF filter 621, the transmitter section filter 623, and/or the antenna duplexer/RF Top filter 602.

The surface acoustic wave apparatus of various preferred embodiments of the present invention has the balanced-to-unbalanced conversion function, in addition to the filter function, and also has superior small insertion loss characteristics. Accordingly, the communication apparatus of another preferred embodiment of the present invention including the surface acoustic wave apparatus with the superior transmission characteristics described above is reduced in size and has greatly improved communication characteristics.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A surface acoustic wave apparatus comprising:
    a piezoelectric substrate;
    at least one longitudinally-coupled-resonator surface acoustic wave filter including at least three interdigital electrode transducers provided on said piezoelectric substrate along the propagation direction of surface acoustic waves; and
    at least one surface acoustic wave resonator that is connected in series to at least two of the at least three interdigital electrode transducers of the longitudinally-coupled-resonator surface acoustic wave filter; wherein
    the parasitic capacitance between the longitudinally-coupled-resonator surface acoustic wave filter and the surface acoustic wave resonator is set to about $6.5 \times 10^2/f_0$ [pF] or less, where $f_0$ represents the center frequency, in megahertz, within the pass band of the longitudinally-coupled-resonator surface acoustic wave filter.

2. A surface acoustic wave apparatus according to claim 1, wherein the longitudinally-coupled-resonator surface acoustic wave filter includes reflectors;
    among the interdigital electrode transducers of the longitudinally-coupled-resonator surface acoustic wave filter, each ground terminal of all the interdigital electrode transducers other than the interdigital electrode transducers that are connected to the surface acoustic wave resonator and the interdigital electrode transducers that are adjacent to the reflectors is connected to only one electrode pad; and ground-side interdigital electrodes of the interdigital electrode transducers other than the interdigital electrode transducers that are connected to the surface acoustic wave resonator and the interdigital electrode transducers that are adjacent to the reflectors are connected to each other via electrode fingers.

3. A surface acoustic wave apparatus according to claim 1, wherein the longitudinally-coupled-resonator surface acoustic wave filter includes five interdigital electrode transducers.

4. A surface acoustic wave apparatus according to claim 1, wherein, in the longitudinally-coupled-resonator surface acoustic wave filter, bus bars of interdigital electrodes are thinner in areas where signal-side interdigital electrodes of the interdigital electrode transducers that are connected to the surface acoustic wave resonator are adjacent to ground-side interdigital electrodes of the interdigital electrode transducers that are adjacent to the interdigital electrode transducers connected to the surface acoustic wave resonator than in other areas of the interdigital electrodes.

5. A surface acoustic wave apparatus according to claim 1, further comprising at least one insulating layer that is provided between the piezoelectric substrate and at least one of an electrode pad arranged at the side to which the surface acoustic wave resonator is connected, the electrode pad being connected to the ground terminal of the interdigital electrode transducer of the longitudinally-coupled-resonator surface acoustic wave filter, a ground line connecting the ground terminal of the interdigital electrode transducer to the electrode pad, and signal lines connecting the longitudinally-coupled-resonator surface acoustic wave filter and the surface acoustic wave resonator.

6. A surface acoustic wave apparatus according to claim 1, wherein the surface acoustic wave apparatus includes a balanced-to-unbalanced conversion function.

7. A surface acoustic wave apparatus according to claim 1, wherein the piezoelectric substrate is housed in a package in a face-down arrangement.

8. A surface acoustic wave apparatus according to claim 1, wherein the piezoelectric substrate is made of X-propagation $LiTaO_3$ that is Y-cut at 40±5°.

9. A communication apparatus comprising the surface acoustic wave apparatus according to claim 1.

10. A surface acoustic wave apparatus comprising:
a piezoelectric substrate;
at least one longitudinally-coupled-resonator surface acoustic wave filter including at least three interdigital electrode transducers provided on said piezoelectric substrate along the propagation direction of surface acoustic waves;
at least one surface acoustic wave resonator that is connected in series to at least two of the at least three interdigital electrode transducers of the longitudinally-coupled-resonator surface acoustic wave filter;
signal lines connecting in series said at least two of the at least three interdigital electrode transducers of the longitudinally-coupled-resonator surface acoustic wave filter to the surface acoustic wave resonator, said signal lines being arranged to surround a ground-side electrode pad connected to an interdigital electrode transducer of the longitudinally-coupled-resonator surface acoustic wave filter; and characteristic selection pads connected adjacent to electrode pads other than said ground-side electrode pad.

11. A surface acoustic wave apparatus according to claim 10, wherein the longitudinally-coupled-resonator surface acoustic wave filter includes reflectors;
among the interdigital electrode transducers of the longitudinally-coupled-resonator surface acoustic wave filter, each ground terminal of all the interdigital electrode transducers other than the interdigital electrode transducers that are connected to the surface acoustic wave resonator and the interdigital electrode transducers that are adjacent to the reflectors is connected to only one electrode pad; and ground-side interdigital electrodes of the interdigital electrode transducers other than the interdigital electrode transducers that are connected to the surface acoustic wave resonator and the interdigital electrode transducers that are adjacent to the reflectors are connected to each other via electrode fingers.

12. A surface acoustic wave apparatus according to claim 10, wherein the longitudinally-coupled-resonator surface acoustic wave filter includes five interdigital electrode transducers.

13. A surface acoustic wave apparatus according to claim 10, wherein, in the longitudinally-coupled-resonator surface acoustic wave filter, bus bars of interdigital electrodes are thinner in areas where signal-side interdigital electrodes of the interdigital electrode transducers that are connected to the surface acoustic wave resonator are adjacent to ground-side interdigital electrodes of the interdigital electrode transducers that are adjacent to the interdigital electrode transducers connected to the surface acoustic wave resonator than in other areas of the interdigital electrodes.

14. A surface acoustic wave apparatus according to claim 10, further comprising at least one insulating layer that is provided between the piezoelectric substrate and at least one of an electrode pad arranged at the side to which the surface acoustic wave resonator is connected, the electrode pad being connected to the ground terminal of the interdigital electrode transducer of the longitudinally-coupled-resonator surface acoustic wave filter, a ground line connecting the ground terminal of the interdigital electrode transducer to the electrode pad, and signal lines connecting the longitudinally-coupled-resonator surface acoustic wave filter and the surface acoustic wave resonator.

15. A surface acoustic wave apparatus according to claim 10, wherein the surface acoustic wave apparatus includes a balanced-to-unbalanced conversion function.

16. A surface acoustic wave apparatus according to claim 10, wherein the piezoelectric substrate is housed in a package in a face-down arrangement.

17. A surface acoustic wave apparatus according to claim 10, wherein the piezoelectric substrate is made of X-propagation $LiTaO_3$ that is Y-cut at 40±5°.

18. A communication apparatus comprising the surface acoustic wave apparatus according to claim 10.

* * * * *